(12) United States Patent
Tsukakoshi

(10) Patent No.: US 7,075,651 B2
(45) Date of Patent: Jul. 11, 2006

(54) IMAGE FORMING CHARACTERISTICS MEASURING METHOD, IMAGE FORMING CHARACTERISTICS ADJUSTING METHOD, EXPOSURE METHOD AND APPARATUS, PROGRAM AND STORAGE MEDIUM, AND DEVICE MANUFACTURING METHOD

(75) Inventor: Toshio Tsukakoshi, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/608,032

(22) Filed: Jun. 30, 2003

(65) Prior Publication Data

US 2004/0059444 A1  Mar. 25, 2004

Related U.S. Application Data

(63) Continuation of application No. PCT/JP01/11588, filed on Dec. 27, 2001.

(30) Foreign Application Priority Data

| Dec. 28, 2000 | (JP) | ............................. 2000-402657 |
| Dec. 28, 2000 | (JP) | ............................. 2000-402686 |
| Nov. 26, 2001 | (JP) | ............................. 2001-359096 |
| Nov. 26, 2001 | (JP) | ............................. 2001-359103 |

(51) Int. Cl.
- *G01B 11/00* (2006.01)
- *G01B 9/00* (2006.01)
- *G03B 27/32* (2006.01)
- *G01N 21/86* (2006.01)
- *G03C 5/00* (2006.01)

(52) U.S. Cl. .................. 356/399; 356/124; 355/77; 250/548; 430/30

(58) Field of Classification Search ........ 356/399–401, 356/614, 124, 127, 450–521; 355/53, 55, 355/67, 77; 430/5, 22, 30; 250/548
See application file for complete search history.

(56) References Cited

U.S. PATENT DOCUMENTS

| 4,786,166 | A |   | 11/1988 | Kroko |
| 5,321,493 | A |   | 6/1994 | Kamon |
| 5,754,299 | A | * | 5/1998 | Sugaya et al. .............. 356/401 |
| 5,807,647 | A |   | 9/1998 | Hashimoto |
| 5,898,501 | A |   | 4/1999 | Suzuki et al. |
| 5,978,085 | A |   | 11/1999 | Smith et al. |
| 6,078,554 | A |   | 6/2000 | Ootaki et al. |
| 6,100,978 | A |   | 8/2000 | Naulleau et al. |
| 6,118,535 | A |   | 9/2000 | Goldberg et al. |
| 6,245,470 | B1 |   | 6/2001 | Kamon |
| 6,248,486 | B1 |   | 6/2001 | Dirksen et al. |
| 6,268,903 | B1 |   | 7/2001 | Chiba et al. |
| 6,329,112 | B1 |   | 12/2001 | Fukuda et al. |
| 6,368,763 | B1 | * | 4/2002 | Dirksen et al. ................ 430/30 |
| 6,459,480 | B1 |   | 10/2002 | Kye |
| 6,548,312 | B1 | * | 4/2003 | Hayano et al. ................. 438/5 |
| 6,570,143 | B1 |   | 5/2003 | Neil et al. |
| 6,741,327 | B1 |   | 5/2004 | Nomura et al. |
| 6,887,625 | B1 | * | 5/2005 | Baselmans et al. ............ 430/5 |
| 6,937,345 | B1 | * | 8/2005 | Kuramoto .................... 356/515 |
| 6,960,415 | B1 | * | 11/2005 | Shiode ......................... 430/30 |
| 6,961,115 | B1 | * | 11/2005 | Hamatani et al. ............. 355/52 |
| 6,975,387 | B1 | * | 12/2005 | Mizuno ....................... 356/121 |
| 2002/0001071 | A1 |   | 1/2002 | Nomura et al. |
| 2002/0008869 | A1 |   | 1/2002 | Van Der Laan et al. |
| 2002/0036758 | A1 |   | 3/2002 | De Mol et al. |
| 2002/0191165 | A1 |   | 12/2002 | Baselmans et al. |
| 2003/0047694 | A1 | * | 3/2003 | Van Der Laan ............. 250/548 |

FOREIGN PATENT DOCUMENTS

| DE | 198 20 785.9 A1 | 10/1999 |
| EP | 0 267 721 | 5/1988 |
| EP | 0 338 200 | 10/1989 |
| EP | 1 079 223 | 2/2001 |
| EP | 1 128 217 | 8/2001 |
| EP | 1 160 626 | 12/2001 |
| EP | 1 355 140 A1 | 10/2003 |
| EP | 1 359 608 A1 | 11/2003 |

| | | |
|---|---|---|
| JP | 5-296879 | 11/1993 |
| JP | 6-235619 | 8/1994 |
| JP | 10-154657 | 6/1998 |
| JP | 11-118613 | 4/1999 |
| JP | 11-233424 | 8/1999 |
| JP | 2000-47103 | 2/2000 |
| JP | 2000-121491 | 4/2000 |
| JP | 2000-146757 | 5/2000 |
| JP | 2000-266640 | 9/2000 |
| JP | 2000-331923 | 11/2000 |
| JP | 2001-230193 | 8/2001 |
| WO | WO 99/60361 | 11/1999 |
| WO | WO 00/31592 | 6/2000 |
| WO | WO 00/55890 | 9/2000 |
| WO | WO 02/50506 A1 | 6/2002 |

OTHER PUBLICATIONS

D. G. Flagello, et al., SPIE Microlithography Seminar, pp. 1-14, "Towards a Comprehensive Control of Full-Field Image Quality in Optical Photolithography", Mar. 1997.

Winter 1998 Microlithography World pp. 11-20 Authors: Donis G. Flagello and Bernd Geh Title: "The influence of lens aberrations in lithography".

Journal of Vacuum Science & Technology B: Microelectronics Processing and Phenomena, American Vacuum Society, New York, NY, US, vol. 16, No. 6, Nov. 1998 pp. 3435-3439 Authors: K. Goldberg, et al. Title: "High-accuracy interferometry of extreme ultraviolet lithographic optical system".

* cited by examiner

*Primary Examiner*—Gregory J. Toatley, Jr.
*Assistant Examiner*—Gordon J. Stock, Jr.
(74) *Attorney, Agent, or Firm*—Oblon, Spivak, McClelland, Maier & Neustadt, P.C.

(57) ABSTRACT

When actual measurement data of a wavefront aberration of a projection optical system is input, a main controller calculates a targeted image forming characteristic of the projection optical system based on the data and a Zernike sensitivity table of the image forming characteristic that is made prior to the input. By using the Zernike sensitivity table, the targeted image forming characteristic can be calculated with only one measurement of wavefront aberration. Moreover, parameters that denote a relation between an adjustment of an adjustable specific optical element and a change in the image forming characteristics of the projection optical system is obtained in advance, and are stored in advance in a storage unit. Then, when the measurement data of the image forming characteristic of the projection optical system is input, the main controller calculates a targeted adjustment amount of the specific optical element using a relation expression between the measurement data, the parameters, and the targeted adjustment amount of the specific optical element, and adjusts the specific optical element based on the calculation results.

80 Claims, 11 Drawing Sheets

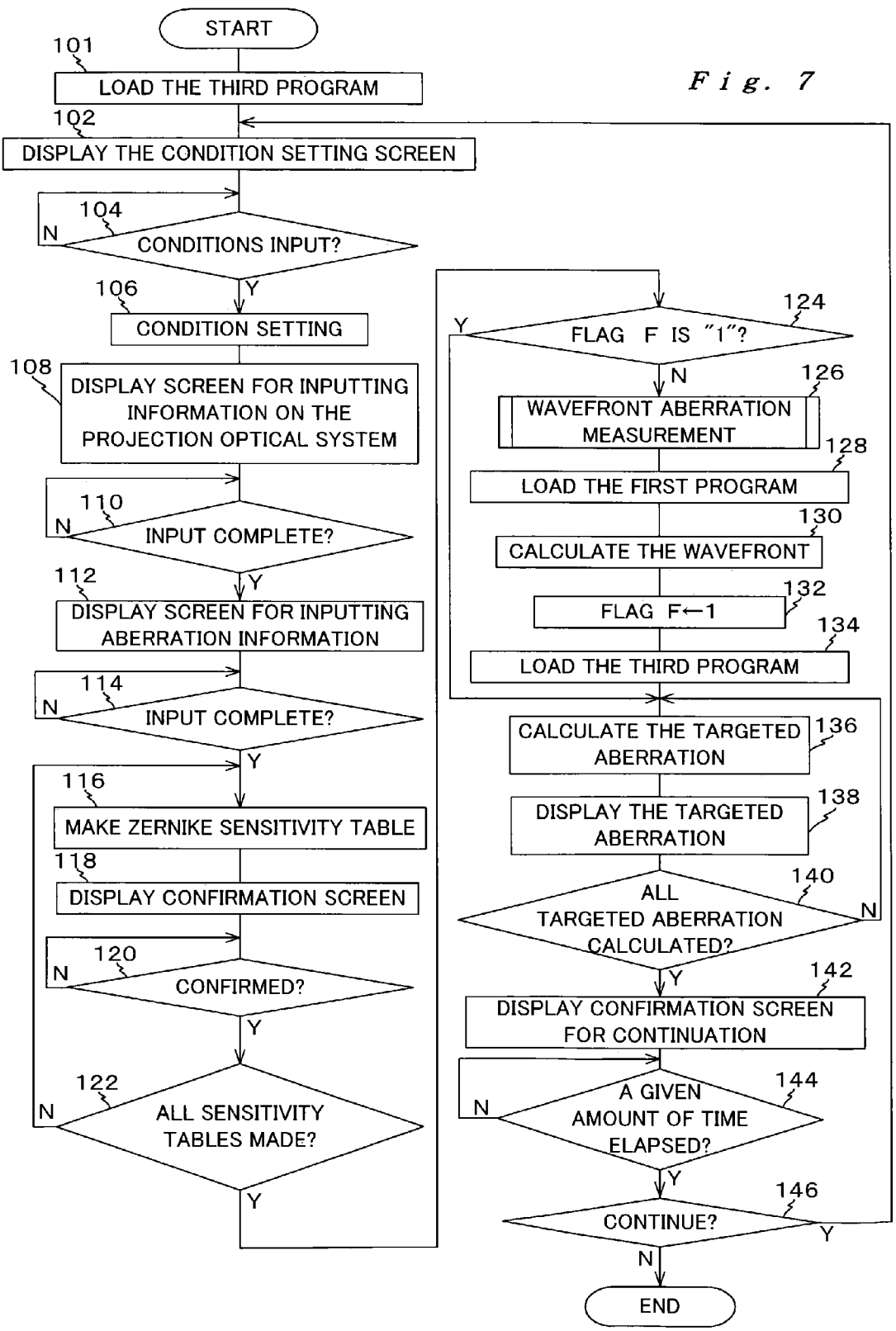

IMAGE FORMING CHARACTERISTICS MEASURING METHOD, IMAGE FORMING CHARACTERISTICS ADJUSTING METHOD, EXPOSURE METHOD AND APPARATUS, PROGRAM AND STORAGE MEDIUM, AND DEVICE MANUFACTURING METHOD

CROSS-REFERENCE TO RELATED APPLICATIONS

This is a continuation of International Application PCT/JP01/11588, with an international filing date of Dec. 27, 2001, the entire content of which being hereby incorporated herein by reference, which was not published in English.

BACKGROUND OF THE INVENTION

1. Field of the Invention

The present invention relates to image forming characteristics measuring methods, image forming characteristics adjusting methods, exposure methods and apparatus, programs and storage mediums, and device manufacturing methods, and more particularly to an image forming characteristics measuring method in which a targeted image forming characteristic of a projection optical system is measured, an image forming characteristics adjusting method in which the image forming characteristic is adjusted, an exposure method in which exposure is performed using a projection optical system whose image forming characteristic has been adjusted according to the image forming characteristics adjusting method and an exposure apparatus suitable for performing the image forming characteristics adjusting method, a program which makes a control computer of the exposure apparatus execute processes of calculating and adjusting a targeted image forming characteristic of a projection optical system and an information storage medium in which such a program is stored and is readable by the computer, and a device manufacturing method using the exposure apparatus.

2. Description of the Related Art

Conventionally, when manufacturing devices such as semiconductors, liquid crystal displays, or the like in a photolithographic process, projection exposure apparatus have been used, such as a reduction projection exposure apparatus based on a step-and-repeat method (a so-called stepper) and a scanning projection exposure apparatus based on a step-and-scan method (a so-called scanning stepper). With such projection exposure apparatus, a pattern formed on a photo-mask or reticle (generally referred to as "reticle" hereinafter) is transferred onto a substrate such as a wafer or a glass plate coated with a photosensitive material such as a photo-resist, via a projection optical system.

When manufacturing semiconductor devices, because different circuit patterns need to be formed in multiple layers on a substrate, it is important to accurately overlay the reticle on which a circuit pattern is formed onto the pattern formed in prior on each shot area on the substrate. In order to have good overlay accuracy, image forming characteristics of the projection optical system need to be adjusted to a desired state (for example, a state where magnification error of the transferred image of a reticle pattern relative to each shot area (pattern) on the substrate is corrected). Even when transferring a reticle pattern of a first layer onto each shot area of the substrate, the image forming characteristics of the projection optical system is preferably adjusted so that reticle patterns of a second layer and the layers onward are accurately transferred onto each shot area.

As a premise for adjusting the image forming characteristics (a type of optical characteristic) of the projection optical system, the image forming characteristics need to be accurately measured (or detected). As the measuring method of the image forming characteristics, a method in which the image forming characteristics are calculated (hereinafter referred to as "exposing method") is mainly used. In this method, exposure is performed using a measurement mask on which a predetermined measurement pattern is formed, and a transferred image such as a resist image obtained by developing the substrate on which the projected image of the measurement pattern is transferred and formed, is measured. Then, based on the measurement results, the image forming characteristics, specifically Seidel's five aberrations (distortion, spherical aberration, astigmatism, field curvature and coma) are calculated. Besides such a method, a method in which the above-mentioned five aberrations are calculated without actually performing exposure (hereinafter referred to as "aerial image measurement method") is also used. In this method, a measurement mask is illuminated with an illumination light, and aerial images (projected images) of measurement patterns formed via the projection optical system are measured, and then the above five aberrations calculated based on the measurement results.

However, with the exposing method or aerial image measurement method described above, in order to obtain all five aberrations, the measurement has to be repeated separately, using the appropriate pattern for each measurement. Furthermore, the order to perform the measurement has to be considered, depending on the type and amount of the aberration to be measured, in order to accurately adjust the projection optical system. For example, when coma is large, the image of the pattern is not resolved, therefore, when aberration such as distortion, spherical aberration, astigmatism are measured in this state, accurate data cannot be obtained. Accordingly, in such a case, the coma needs to be reduced to a certain level before measurement on distortion or the like is performed.

In addition, due to higher integration of semiconductor devices or the like in recent years, circuit patterns are becoming finer. Thus, correcting only the Seidel's five aberrations is not sufficient enough, and requirements are pressing for an overall adjustment of the image forming characteristics of the projection optical system, including the higher order of aberrations. In order to perform such overall adjustment on the image forming characteristics, lens elements that require adjustment and their adjustment amount need to be calculated, by performing a light-ray-trace computation using data (such as curvature, refractive index, and thickness) of individual lens elements composing the projection optical system.

However, because data of individual lens elements are confidential for the exposure apparatus maker, it is usually difficult for a service technician repairing or adjusting the exposure apparatus or a user to obtain such data. In addition, since the light-ray-trace computation requires an enormous amount of time, it is not realistic for the service technician to perform the computation on site.

In addition, the effect of aberrations of the projection optical system on the image forming characteristics of various patterns are different, which also makes a user of an exposure apparatus have different requirements depending on the type of pattern to be projected. For example, a contact-hole pattern is affected particularly by astigmatism. A line-and-space pattern with a thin line-width is greatly affected by coma, and for example, best focus position is different between an isolated line pattern and a line-and-space pattern.

Under such circumstances, new technologies are expected, such as a new technology to enable an operator in a semiconductor factory to perform a simple and accurate measurement of the image forming characteristics (a type of optical characteristic) of a projection optical system, especially the image forming characteristics (aberrations) predicted to have a great influence on the accuracy when transferring a subject pattern onto a substrate, or a new technology that can enable a service technician or the like in a semiconductor factory to perform a relatively simple and highly accurate adjustment on the image forming characteristics of the projection optical system.

SUMMARY OF THE INVENTION

The present invention was made under such circumstances, and has as its first purpose to provide an image forming characteristics measuring method in which a targeted image forming characteristic of a projection optical system can be measured easily and accurately.

The second purpose of the present invention is to provide an image forming characteristics adjusting method in which an image forming characteristic of a projection optical system can be adjusted easily and accurately.

The third purpose of the present invention is to provide an exposure method in which fine patterns can be formed with good precision on a substrate.

The fourth purpose of the present invention is to provide an exposure apparatus that can transfer a pattern of a mask onto a substrate with good precision.

The fifth purpose of the present invention is to provide a device manufacturing method that contributes to improving productivity of the devices.

The sixth purpose of the present invention is to provide a program suitable for use in each of the exposure apparatus, and an information storage medium where such a program is stored and is readable by a computer.

According to a first aspect of the present invention, there is provided an image forming characteristics measuring method in which at least one image forming characteristic of a projection optical system is measured, the method comprising: a measuring process in which wavefront aberration of the projection optical system is measured at one measurement point at the least in a field of the projection optical system; and a calculating process in which at least one targeted image forming characteristic is calculated, based on the measuring of wavefront aberration and a Zernike sensitivity table of the targeted image forming characteristic that is prepared in advance.

The "targeted image forming characteristic" in this case, is a concept that includes both a targeted image forming characteristic and its index. In this description, the term "targeted image forming characteristic" is used in such meaning.

In this method, after the wavefront aberration of the projection optical system is measured in at least one measurement point in the field of the projection optical system, the targeted image forming characteristic is calculated based on the measured aberration and the Zernike sensitivity table of the image forming characteristic that is prepared in advance. By preparing the Zernike sensitivity table in advance in such manner, the targeted image forming characteristic can be calculated with only one measurement of the wavefront aberration. In this case, because the measurement is performed on wavefront aberration, which is the overall image forming characteristics of the projection optical system, the targeted image forming characteristic can be obtained with good accuracy.

In this case, in the calculating process, when the targeted image forming characteristic include image forming characteristics of a plurality of types, the image forming characteristics of a plurality of types included in the targeted image forming characteristic can each be calculated, based on the measuring of wavefront aberration and a Zernike sensitivity table for each of the image forming characteristics of a plurality of types.

With the image forming characteristics measuring method in the present invention, the Zernike sensitivity table of the image forming characteristic may be made separately for various image forming characteristics, taking into consideration various patterns, or the method may further comprise: a making process in which conditions are set in order to make a Zernike sensitivity table, based on information on a pattern subject to projection by the projection optical system and the targeted image forming characteristic, and a Zernike sensitivity table of the targeted image forming characteristic that corresponds to information related to a given aberration is made, based on information related to the projection optical system and information related to the given aberration, prior to the measuring process. In the latter case, the information related to the projection optical system can include numerical aperture of the projection optical system, illumination condition, and wavelength of illumination light.

With the image forming characteristics measuring method in the present invention, when the Zernike sensitivity table is made prior to the measuring process, in the making process, when the targeted image forming characteristic include image forming characteristics of a plurality of types, a Zernike sensitivity table for each of the image forming characteristics of a plurality of types that correspond to the information related to aberration can be made.

With the image forming characteristics measuring method in the present invention, it can further comprise: a displaying process in which information related to the targeted image forming characteristic that has been calculated is displayed.

According to a second aspect of the present invention, there is provided a first image forming characteristics adjusting method in which at least one image forming characteristic of a projection optical system is adjusted, the method comprising: a measuring process in which at least one targeted image forming characteristic is measured using the image forming characteristics measuring method according to Claim 1; and an adjusting process in which the projection optical system is adjusted based on results of the measuring of the targeted image forming characteristic.

In the adjusting method, because at least one targeted image forming characteristic is measured using the image forming characteristics measuring method according to the present invention, the targeted image forming characteristic can be obtained with good accuracy. And the projection optical system is adjusted based on the image forming characteristic that is obtained (the measurement results of the image forming characteristic). Therefore, the targeted image forming characteristic of the projection optical system can be adjusted with good accuracy. For example, by making the targeted image forming characteristic an image forming characteristic (aberration) that particularly influences the image forming of a subject pattern, the image forming characteristic of the projection optical system can be adjusted as much as possible according to the subject pattern.

In this case, the projection optical system can be structured comprising a plurality of optical elements that include a specific optical element used for adjustment, and adjustment of the projection optical system can be performed by deciding a targeted adjustment amount of the specific optical element by computation using a relation expression between the image forming characteristic that has been measured, parameters, and a targeted adjustment amount of the specific optical element, and by adjusting the specific optical element for adjustment according to the decided targeted adjustment amount, the parameters denoting a relation between adjustment of the specific optical element and a change in image forming characteristics of the projection optical system.

According to a third aspect of the present invention, there is provided a second image forming characteristics adjusting method in which at least one image forming characteristic of a projection optical system comprising a plurality of optical elements that include a specific optical element used for adjustment is adjusted, the method comprising: an obtaining process in which at least one image forming characteristic of the projection optical system is obtained, by obtaining information on light via the projection optical system at one measurement point at the least in a field of the projection optical system; and a deciding process in which a targeted adjustment amount of the specific optical element is decided by computation using a relation expression between the image forming characteristic that has been obtained, parameters, and a targeted adjustment amount of the specific optical element, the parameters denoting a relation between adjustment of the specific optical element and a change in image forming characteristics of the projection optical system.

"A specific optical element used for adjustment" in this case, refers to a specific optical element that is used for adjusting the image forming characteristic, and besides the case when the image forming characteristic of the projection optical system is adjusted by driving or changing the specific optical element, the case such as when the image forming characteristic is adjusted by reprocessing or exchanging the specific optical element is also included. That is, besides adjustment (correction) of the image forming characteristic at the adjustment stage, "adjustment" with the specific optical element also includes the making of the projection optical system itself whose image forming characteristic is adjusted. In addition, as a matter of course, the specific optical element for adjustment is not limited to one, and may be in plurals. In this description, the term "A specific optical element used for adjustment" is used in such a meaning.

In addition, when the specific optical element for adjustment is in plurals, the "targeted adjustment amount" includes the case when the adjustment amount is zero, that is, the case when no adjustment is made. In this description, the term "targeted adjustment amount" is used in such a meaning.

In this method, when adjusting the projection optical system, information on light via the projection optical system is obtained at one measurement point in the least in the field of the projection optical system, and the image forming characteristic is obtained. And, by performing computation, using a relation expression between the image forming characteristic that has been obtained, parameters denoting the relation between the adjustment of the specific optical element and the change in the image forming characteristics of the projection optical system, and the targeted adjustment amount of the specific optical element, with the targeted adjustment amount as an unknown value, the unknown value, that is, the targeted adjustment amount of the specific optical element is decided by computation. In this manner, by using the relation expression between the actual measurement results of the image forming characteristic (aberration), parameters denoting the relation between the adjustment of the specific optical element and the change in the image forming characteristics of the projection optical system, and the targeted adjustment amount of the specific optical element, the targeted adjustment amount of the specific optical element for correcting the image forming characteristic can be calculated easily. This makes it possible to adjust the image forming characteristic of the projection optical system in a simple manner with high precision.

In this case, the method may further comprise an obtaining process in which the parameters are obtained, prior to the obtaining process in which the image forming characteristic is obtained.

With the second image forming characteristics adjusting method in the present invention, the image forming characteristic subject to adjustment may be only one image forming characteristic, or the image forming characteristic may include a plurality of types of image forming characteristics. In the latter case, in the obtaining process in which the image forming characteristic is obtained, image forming characteristics of a plurality of types can be obtained, and in the deciding process, a target adjustment amount of the specific optical element can be decided by computation using a relation expression between the image forming characteristics of a plurality of types that have been obtained, parameters, and a targeted adjustment amount of the specific optical element, the parameters denoting a relation between adjustment of the specific optical element and a change in image forming characteristics of the projection optical system.

With the second image forming characteristics measuring method in the present invention, the image forming characteristic subject to adjustment can be image forming characteristics of various types, and corresponding to such image forming characteristics various relation expressions can be considered. For example, the image forming characteristic can be a wavefront aberration expressed in a Zernike polynomial.

In this case, the relation expression can be an equation that includes a weighting function that performs weighting on a coefficient of any term in coefficients of each term of the Zernike polynomial.

According to a fourth aspect of the present invention, there is provided an exposure method in which a pattern formed on a mask is transferred onto a substrate via a projection optical system, the exposure method comprising: an adjusting process in which at least one image forming characteristic of the projection optical system is adjusted using the image forming characteristics adjusting method according to any one of the first and second image forming characteristics adjusting methods; and a transferring process in which the pattern is transferred onto the substrate using the projection optical system whose image forming characteristic is adjusted.

In the method, the image forming characteristic of the projection optical system is adjusted using either the first or the second image forming characteristics adjusting method of the present invention, and the pattern of the mask is transferred onto the substrate via the projection optical system whose image forming characteristic is adjusted. Therefore, because the pattern of the mask is transferred onto the substrate via the projection optical system whose image forming characteristic is adjusted with high precision, it allows fine patterns to be formed on the substrate with good precision.

Especially when the projection optical system is adjusted using the first image forming characteristics adjusting method of the present invention, the targeted image forming characteristic, for example, the image forming characteristic (aberration) that particularly influences the image forming of the subject pattern, is adjusted as much as possible. Accordingly, even when exposure is performed using a mask on which a fine pattern is formed as the subject pattern, the pattern is transferred on the substrate via a projection system whose image forming characteristic (aberration) that particularly influences the image forming of the fine pattern is adjusted as much as possible.

According to a fifth aspect of the present invention, there is provided a first exposure apparatus that transfers a pattern formed on a mask onto a substrate via a projection optical system, the exposure apparatus comprising: a measuring unit that measures wavefront aberration of the projection optical system, the measuring unit being at least partly attachable to an exposure apparatus main body including the projection optical system; and a first computing unit that calculates at least one targeted image forming characteristic based on wavefront aberration of the projection optical system measured by the measuring unit and a Zernike sensitivity table of the targeted image forming characteristic.

In this apparatus, when the measuring unit measures the wavefront aberration of the projection optical system, the first computing unit calculates the targeted image forming characteristic based on the calculated wavefront aberration of the projection optical system and the Zernike sensitivity table of the targeted image forming characteristic. In this manner, by using the Zernike sensitivity table, the targeted image forming characteristic can be calculated with only one measurement of the wavefront aberration. In this case, because the measurement is performed on wavefront aberration, which is the overall image forming characteristics of the projection optical system, the targeted image forming characteristic can be obtained with good accuracy. And, by performing exposure in a state where the targeted image forming characteristic obtained with good accuracy becomes optimum (for example, the difference between the target value is minimal), the mask pattern can be transferred onto the substrate with good accuracy.

In this case, the first exposure apparatus can further comprise a storage unit that stores the Zernike sensitivity table in advance.

With the first exposure apparatus according to the present invention, the Zernike sensitivity table can be a Zernike sensitivity table of the targeted image forming characteristic that corresponds to information on a given aberration on exposure of a subject pattern.

The first exposure apparatus according to the present invention can further comprise: an input unit used to input information of various types including information on the subject pattern, information on the targeted image forming characteristic, information related to the projection optical system, and information on the given aberration; and a second computing unit that set conditions in order to make a Zernike sensitivity table based on the information on the subject pattern and the targeted image forming characteristic input via the input unit, and based on information related to the projection optical system and information related to the given aberration input via the input unit, the second computing unit makes a Zernike sensitivity table of the targeted image forming characteristic that corresponds to information on the given aberration on exposure of the subject pattern.

In this case, the information related to the projection optical system can include numerical aperture of the projection optical system, illumination condition, and wavelength of illumination light.

The first exposure apparatus according to the present invention can further comprise a display unit which displays information on the targeted image forming characteristic calculated by the first computing unit on screen.

The first exposure apparatus according to the present invention can further comprise an image forming characteristics correcting unit that corrects at least one image forming characteristic of the projection optical system based on calculation results of the targeted image forming characteristic by the first computing unit.

In this case, the projection optical system can be structured comprising a plurality of optical elements that include a specific optical element used for adjustment, and the image forming characteristics correcting unit can have a storage unit in which parameters are stored in advance that denotes a relation between adjustment of the specific optical element and a change in image forming characteristics of the projection optical system, and a calculation unit that calculates a targeted adjustment amount of the specific optical element using a relation expression between information on the image forming characteristic that has been calculated, the parameters, and a targeted adjustment amount of the specific optical element.

According to a sixth aspect of the present invention, there is provided a second exposure apparatus that transfers a pattern formed on a mask onto a substrate via a projection optical system, the exposure apparatus comprising: the projection optical system that comprises a plurality of optical elements including a specific optical element used for adjustment; a storage unit in which parameters are stored in advance that denotes a relation between adjustment of the specific optical element and a change in image forming characteristics of the projection optical system, a measuring unit that measures at least one image forming characteristic of the projection optical system, the measuring unit being at least partly attachable to an exposure apparatus main body including the projection optical system; and a computing unit that calculates a targeted adjustment amount of the specific optical element using a relation expression between an actual measurement data measured by the measuring unit, the parameters, and a targeted adjustment amount of the specific optical element.

In this apparatus, parameters are obtained in advance that denote the relation between the adjustment of an adjustable specific optical element and the change in image forming characteristics of the projection optical system, and are stored in the storage unit. And, when the measuring unit actually measures the image forming characteristic of the projection optical system, the computing unit then calculates the targeted adjustment amount of the specific optical element using the relation expression between the actual measurement data of the image forming characteristic, the above parameters, and the targeted adjustment amount of the specific optical element. As is described, because the above parameters are obtained in advance and stored in the storage unit, when the image forming characteristic (aberration) is actually measured the targeted adjustment amount of the specific optical element for correcting the image forming characteristic can be calculated easily, and by adjusting the specific optical element based on the calculation results, the image forming characteristic of the projection optical system can be adjusted simply but with high precision. Accordingly, by performing exposure using such projection optical system whose image forming characteristic is adjusted with high precision, the pattern of the mask can be transferred onto the substrate with good accuracy via the projection optical system.

In this case, the adjustment based on the above calculated targeted adjustment amount of the specific optical element can be performed manually via an operator, or, for example, the second exposure apparatus can further comprise an image forming characteristics adjusting unit that adjusts at least one image forming characteristic of the projection optical system by adjusting the specific optical element according to the calculated targeted adjustment amount.

With the second exposure apparatus according to the present invention, the image forming characteristic subject to adjustment can be one image forming characteristic, however, the image forming characteristic can include image forming characteristics of a plurality of types. In the latter case, the measuring unit can measure image forming characteristics of a plurality of types of the projection optical system, and the computing unit can calculate a targeted adjustment amount of the specific optical element using a relation expression between an actual measurement data of the image forming characteristics of a plurality of types measured by the measuring unit, the parameters, and a targeted adjustment amount of the specific optical element.

With the second exposure apparatus according to the present invention, the image forming characteristic subject to adjustment can be image forming characteristics of various types, and corresponding to such image forming characteristics various relation expressions can be considered. For example, the image forming characteristic can be a wavefront aberration expressed in a Zernike polynomial.

In this case, the relation expression can be an equation that includes a weighting function that performs weighting on a coefficient of any term in coefficients of each term of the Zernike polynomial.

According to a seventh aspect of the present invention, there is provided a first program that makes a control computer of an exposure apparatus that transfers a pattern of a mask onto a substrate via a projection optical system execute a predetermined process, the program making the control computer execute: a condition setting procedure in which conditions are set for making a Zernike sensitivity table in response to an input of information related to information on a subject pattern and information on a targeted image forming characteristic; and a making procedure in which a Zernike sensitivity table of the targeted image forming characteristic corresponding to information on given aberration on exposure of the subject pattern is made, in response to an input of information related to the projection optical system and information on the given aberration.

When the program is installed in the control computer of the exposure apparatus, by inputting information on the subject pattern and information related to the targeted image forming characteristic in the computer, condition setting for making a Zernike sensitivity table is performed by the computer in response to the input. Next, by inputting information related to the projection optical system and information on a given aberration into the computer that has completed such condition setting, the computer makes a Zernike sensitivity table of the targeted image forming characteristic that corresponds to the information on the given aberration on exposure of the subject pattern in response to the input. That is, by only inputting minimal information necessary for making the Zernike sensitivity table into the computer, such as information on the subject pattern, information related to the targeted image forming characteristic, information related to the projection optical system, and information on the given aberration, a Zernike sensitivity table of the targeted image forming characteristic that corresponds to the given aberration on exposure of a subject pattern can be easily made. The Zernike sensitivity table, which is made, can also be used in other exposure apparatus that comprises the same type of projection optical system.

After creating the Zernike sensitivity table in the manner described above, the program can further make the control computer execute a calculating procedure in which the targeted image forming characteristic of the projection optical system is calculated in response to an input of actual measurement data of wavefront aberration of the projection optical system, based on the actual measurement data and the Zernike sensitivity table. In such a case, by further inputting the actual measurement data of wavefront aberration of the projection optical system, the computer calculates the targeted image forming characteristic of the projection optical system based on the actual data and the Zernike sensitivity table in response to the input. Accordingly, only by inputting the actual measurement data of the wavefront aberration obtained in at least one measurement, the targeted image forming characteristic can be calculated by the computer accurately in a short period of time.

With the first program according to the present invention, the program can further make the control computer execute a displaying procedure in which information on the targeted image forming characteristic that has been calculated is displayed on a display unit.

With the first program according to the present invention, the program can further make the control computer execute an adjusting procedure in which the projection optical system is adjusted so that the targeted image forming characteristic that has been calculated becomes optimal (for example, the difference between the target value is minimal).

With the first program according to the present invention, when the targeted image forming characteristic is calculated in addition to the making of the Zernike sensitivity table described above, the program can further make the control computer execute: a making procedure in which the Zernike sensitivity table is made in response to input of different information related to the projection optical system and input of information on the given aberration, by each different information related to the projection optical system; a calculating procedure in which the targeted image forming characteristic of the projection optical system is calculated by each different information related to the projection optical system in response to input of actual measurement data of wavefront aberration of the projection optical system, based on the actual measurement data and the Zernike sensitivity table; and a deciding procedure in which an optimum exposure condition is decided by finding information related to the projection optical system that makes the targeted image forming characteristic that has been calculated become optimal (for example, the difference between the target value is minimal).

In this case, the program can further make the control computer execute a setting procedure in which the optimum exposure condition that has been decided is set.

According to an eighth aspect of the present invention, there is provided a second program that makes a control computer execute a process, the program making the control computer execute: a procedure of calculating a targeted image forming characteristic of a projection optical system in response to an input of information related to the targeted image forming characteristic and an input of actual measurement data of wavefront aberration of the projection optical system, based on the actual measurement data and a Zernike sensitivity table of the targeted image forming characteristic that is prepared in advance.

When the program is installed in the control computer of the exposure apparatus, by inputting information related to the targeted image forming characteristic and the actual measurement data of wavefront aberration of the projection optical system into the computer, the computer calculates the targeted image forming characteristic of the projection optical system based on the actual measurement data and the Zernike sensitivity table of the targeted image forming characteristic prepared in advance in response to the input. In such a case, control computers of other exposure apparatus that comprise the same type of projection optical system can use the Zernike sensitivity table, which is a Zernike sensitivity table of the targeted image forming characteristic that is made using the first program of the present invention. Accordingly, only by inputting information related to the targeted image forming characteristic and the actual measurement data of the wavefront aberration obtained in at least one measurement, the targeted image forming characteristic can be calculated by the computer accurately in a short period of time. In this case, for example, the image forming characteristic that greatly affects the image forming of the subject pattern is preferably chosen as the targeted image forming characteristic.

With the second program according to the present invention, the program can further make the control computer execute a displaying procedure in which information on the targeted image forming characteristic that has been calculated is displayed on a display unit.

With the second program according to the present invention, the program can further make the control computer execute an adjusting procedure in which the projection optical system is adjusted so that the targeted image forming characteristic that has been calculated becomes optimal.

According to a ninth aspect of the present invention, there is provided a third program that makes a control computer of an exposure apparatus that transfers a pattern of a mask onto a substrate via a projection optical system execute a predetermined process, the program making the control computer execute: a calculating procedure in which a targeted adjustment amount of the projection optical system is calculated in response to an input of actual measurement data of image forming characteristic of the projection optical system, using a relation expression between the actual measurement data of image forming characteristic that has been input, parameters, and a targeted adjustment amount of the projection optical system, the parameters denoting a relation between adjustment of the projection optical system and a change in image forming characteristics of the projection optical system.

With this program, the program is installed in the control computer of the exposure apparatus in advance. And, when the actual measurement data of the image forming characteristic of the projection optical system is input, the control computer of the exposure apparatus calculates the targeted adjustment amount using the relation expression between the actual measurement data that has been input, the parameters denoting the relation between the adjustment of the projection optical system and the change in the image forming characteristics of the projection optical system, and the targeted adjustment amount of the projection optical system. That is, the operator or the like only has to actually measure the image forming characteristic (aberration) and input the actual measurement values of the image forming characteristic, to calculate the targeted adjustment amount of the projection optical system in order to correct the image forming characteristic. Accordingly, for example, by adjusting the projection optical system based on the calculated targeted adjustment amount, the image forming characteristic of the projection optical system can be easily adjusted, with high precision.

In this case, the program can further make the control computer execute a displaying procedure in which information on the targeted adjustment amount that has been calculated is displayed on a display unit.

With the third program according to the present invention, the program can further make the control computer execute an adjusting procedure in which the projection optical system is adjusted based on the target adjustment amount that has been calculated.

With the third program according to the present invention, the parameters can be parameters denoting a relation between adjustment of a specific optical element used for adjustment that structures the projection optical system and a change in the image forming characteristics, and the targeted adjustment amount can be an amount of the specific optical element that needs to be adjusted.

With the third program according to the present invention, the image forming characteristic can be a wavefront aberration expressed in a Zernike polynomial.

In this case, the relation expression can be an equation that includes a weighting function that performs weighting on a coefficient of any term in coefficients of each term of the Zernike polynomial.

With the third program according to the present invention, the program can further make the control computer execute: a condition setting procedure in which conditions are set for making a Zernike sensitivity table in response to an input of information related to information on a subject pattern and an input of information on a targeted image forming characteristic; a making procedure in which a Zernike sensitivity table of the targeted image forming characteristic corresponding to information on aberration is made, in response to an input of information related to the projection optical system and information on a given aberration; and a calculating procedure in which the targeted image forming characteristic is calculated in response to an input of actual measurement data of wavefront aberration of the projection optical system, based on the measurement data and the Zernike sensitivity table.

With the third program according to the present invention, the program can further make the control computer execute a displaying procedure in which information on the targeted image forming characteristic that has been calculated is displayed on a display unit.

With the third program according to the present invention, the program can further make the control computer execute a converting procedure in which information obtained on light via the projection optical system at one measurement point at the least in a field of the projection optical system is converted into actual measurement data of the wavefront aberration of the projection optical system.

According to a tenth aspect of the present invention, there is provided a third image forming characteristics adjusting method in which at least one image forming characteristic of a projection optical system is adjusted, the method including: a measuring process in which information related to wavefront aberration of the projection optical system is measured; and the image forming characteristic is adjusted by driving an optical element of the projection optical system, based on data of a relation between an adjustment amount of the optical element and a change in coefficients of each term in a Zernike polynomial, and the information related to wavefront aberration.

With this method, when adjusting at least one image forming characteristic of the projection optical system, information related to the wavefront aberration of the projection optical system is measured, and based on the information related to the wavefront aberration that is measured and data on the relation between the adjustment amount of the optical element of the projection optical system and the change in coefficients of each term in the Zernike polynomial, the image forming characteristic is adjusted by driving the optical element. In this case, the targeted adjustment amount of the optical element for correcting the image forming characteristic of the projection optical system can be calculated easily, based on the adjustment amount of the optical element of the projection optical system and the change in coefficients of each term in the Zernike polynomial and the information related to the wavefront aberration that has been measured. As a consequence, the image forming characteristic of the projection optical system can be adjusted easily with high precision.

According to an eleventh aspect of the present invention, there is provided an exposure method in which a pattern is transferred onto an object via a projection optical system, the method including a measuring process in which information related to wavefront aberration of the projection optical system is measured; a calculating process in which a targeted image forming characteristic is calculated for each of a plurality of exposure conditions settable when the pattern is projected by the projection optical system, based on the information related to wavefront aberration and a Zernike sensitivity table that is obtained by giving a predetermined value of aberration to each term in a Zernike polynomial and calculating a targeted image forming characteristic of the projection optical system in each of a plurality of terms in the Zernike polynomial; and a transferring process in which the pattern is transferred onto the object with an optimum exposure condition set with respect to the pattern, based on the targeted image forming characteristic that has been calculated for each of the exposure conditions.

With this method, the information related to the wavefront aberration of the projection optical system is measured prior to exposure, and based on the information related to the aberration and the Zernike sensitivity table that is obtained by calculating the targeted image forming characteristic of the projection optical system in each of a plurality of terms in the Zernike polynomial and by giving a predetermined value of aberration to each term in a Zernike polynomial, the targeted image forming characteristics are calculated for each of a plurality of exposure conditions settable when the pattern is projected by the projection optical system. And, when exposure is performed, the optimum condition is set for the pattern based on targeted image forming characteristic calculated for each of the exposure conditions, and the pattern is transferred onto the object. Therefore, because exposure is performed under the optimum condition according to the pattern, the pattern can be transferred onto the object with good accuracy, even when it is fine pattern.

According to a twelfth aspect of the present invention, there is provided a third exposure apparatus that transfers a pattern onto an object via a projection optical system, the exposure apparatus comprising: a computing unit that obtains a targeted image forming characteristic, based on information related to wavefront aberration of the projection optical system and a Zernike sensitivity table that is obtained by giving a predetermined value of aberration to each term in a Zernike polynomial and calculating the targeted image forming characteristic of the projection optical system in each of a plurality of terms in the Zernike polynomial; and an adjusting unit that adjusts at least one image forming characteristic of the projection optical system based on one of the information related to wavefront aberration and the targeted image forming characteristic that has been calculated.

With this apparatus, the computing unit obtains the targeted image forming characteristic, based on the information related to the wavefront aberration of the projection optical system and the Zernike sensitivity table obtained by calculating the targeted image forming characteristic of the projection optical system in each of a plurality of terms in the Zernike polynomial, by giving a predetermined value of aberration to each term in the Zernike polynomial. And, the adjusting unit adjust the image forming characteristic of the projection optical system based on the information related to the wavefront aberration or the image forming characteristic that has been calculated. Accordingly, the image forming characteristic of the projection optical system is adjusted with good accuracy including the high order component based on the information related to the wavefront aberration, or adjustment to correct the targeted image forming characteristic with good accuracy is performed. In any case, by using the projection optical system that has been adjusted to transfer the pattern onto the object, fine patterns can be transferred onto the object with good accuracy.

According to a thirteenth aspect of the present invention, there is provided a fourth exposure apparatus that transfers a pattern onto an object via a projection optical system, the exposure apparatus comprising: a storage unit that stores data related to a relation between an adjustment amount of an optical element of the projection optical system and a change in coefficients of each term in a Zernike polynomial; and an adjusting unit that adjusts at least one image forming characteristic of the projection optical system based on information related to wavefront aberration of the projection optical system and the data.

With this apparatus, the adjusting unit adjusts the image forming characteristic of the projection optical system based on the data on the relation between the adjustment amount of the optical element of the projection optical system and the change in coefficients of each term in the Zernike polynomial and the information related to the wavefront aberration of the projection optical system that are stored in the storage unit. In this case, because the targeted adjustment amount of the optical element for correcting the image forming characteristic of the projection optical system can be easily calculated, based on the data on the relation between the adjustment amount of the optical element of the projection optical system and the change in coefficients of each term in the Zernike polynomial and the information related to the wavefront aberration (such as the measurement values of the wavefront aberration), the image forming characteristic of the projection optical system can be adjusted easily with high precision. And, by performing exposure using the projection optical system that has been adjusted, the pattern can be transferred onto the object with good accuracy.

According to a fourteenth aspect of the present invention, there is provided a fifth exposure apparatus that transfers a pattern onto an object via a projection optical system, the exposure apparatus comprising: a computing unit that obtains a targeted image forming characteristic when a plurality of exposure conditions are settable on projecting the pattern by the projection optical system, based on information related to wavefront aberration of the projection optical system and a Zernike sensitivity table that is obtained by giving a predetermined value of aberration to each term in a Zernike polynomial and calculating the targeted image forming characteristic of the projection optical system in each of a plurality of terms in the Zernike polynomial; and an exposure control unit that sets an optimum exposure condition for the pattern, based on the targeted image forming characteristic that has been calculated for each of the exposure conditions.

With this apparatus, the computing unit calculates the targeted image forming characteristic for a plurality of exposure conditions that are settable when projecting the pattern with the projection optical system, based on the information related to the wavefront aberration of the projection optical system and the Zernike sensitivity table obtained by calculating the targeted image forming characteristic of the projection optical system in each of a plurality of terms in the Zernike polynomial, by giving a predetermined value of aberration to each term in the Zernike polynomial. And, the exposure control unit sets the optimum exposure condition for the pattern based on the targeted image forming characteristic that has been calculated for each of the exposure conditions. In this manner, exposure is performed under the optimum condition corresponding to the pattern, therefore, even if the pattern is a fine pattern, it can be transferred with good accuracy on the object.

According to a fifteenth aspect of the present invention, there is provided a fourth program that makes a control computer of an exposure apparatus that transfers a pattern of a mask onto an object via a projection optical system execute a predetermined process, the program making the control computer execute: a measuring procedure in which information related to wavefront aberration of the projection optical system is measured; and an adjusting procedure in which at least one image forming characteristic is adjusted by driving an optical element of the projection optical system, based on data of a relation between an adjustment amount of the optical element and a change in coefficients of each term in a Zernike polynomial, and information related to the wavefront aberration.

According to a sixteenth aspect of the present invention, there is provided a fifth program that makes a control computer of an exposure apparatus that transfers a pattern of a mask onto an object via a projection optical system execute a predetermined process, the program making the control computer execute: a measuring procedure in which information related to wavefront aberration of the projection optical system is measured; a calculating procedure in which a targeted image forming characteristic is calculated in a plurality of exposure conditions settable when projecting the pattern by the projection optical system, based on information related to wavefront aberration of the projection optical system and a Zernike sensitivity table that is obtained by giving a predetermined value of aberration to each term in a Zernike polynomial and calculating the targeted image forming characteristic of the projection optical system in each of a plurality of terms in the Zernike polynomial; and a transferring procedure in which the pattern is transferred onto the object with an optimum exposure condition set with respect to the pattern, based on the targeted image forming characteristic that has been calculated for each of the exposure conditions.

According to a seventeenth aspect of the present invention, there is provided a sixth program that makes a control computer of an exposure apparatus that transfers a pattern of a mask onto an object via a projection optical system execute a predetermined process, the program making the control computer execute: an obtaining procedure in which a targeted image forming characteristic is obtained, based on information related to wavefront aberration of the projection optical system and a Zernike sensitivity table that is obtained by giving a predetermined value of aberration to each term in a Zernike polynomial and calculating the targeted image forming characteristic of the projection optical system in each of a plurality of terms in the Zernike polynomial; and an adjusting procedure in which at least one image forming characteristic of the projection optical system is adjusted, based on the information related to wavefront aberration and the image forming characteristic that has been calculated.

The first to sixth programs of the present invention can be stored in a storage medium. Therefore, according to an eighteenth aspect of the present invention, there is provided an information storage medium that can be read by a computer in which any one of the first to sixth programs is recorded.

In addition, in a lithographic process, by performing exposure using one of the first to fifth exposure apparatus according to the present invention, patterns can be formed with good precision on a substrate, which allows production of highly integrated microdevices with good yield. Accordingly, further from another aspect of the present invention, there is provided a device manufacturing method that uses one of the first to fifth exposure apparatus of the present invention (that is, a device manufacturing method that includes the process of transferring a pattern onto a photosensitive object using one of the first to fifth exposure apparatus).

In addition, when making the exposure apparatus, by adjusting the projection optical system using one of the first to third image forming characteristics adjusting method after the projection optical system has been incorporated into the main body of the exposure apparatus, the image forming characteristics of the projection optical system can be adjusted with good accuracy. Accordingly, yet further from another aspect of the present invention, there is provided a making method of an exposure apparatus that includes the process of adjusting the projection optical system using one of the first to third image forming characteristics adjusting methods.

BRIEF DESCRIPTION OF THE DRAWINGS

FIG. 7 is a flow chart schematically showing a control algorithm of a CPU of a main controller for measurement of an image forming characteristic and display (simulation);

DESCRIPTION OF THE PREFERRED EMBODIMENTS

An embodiment of the present invention will be described below with reference to FIGS. 1 to 9B.

Figure 1:
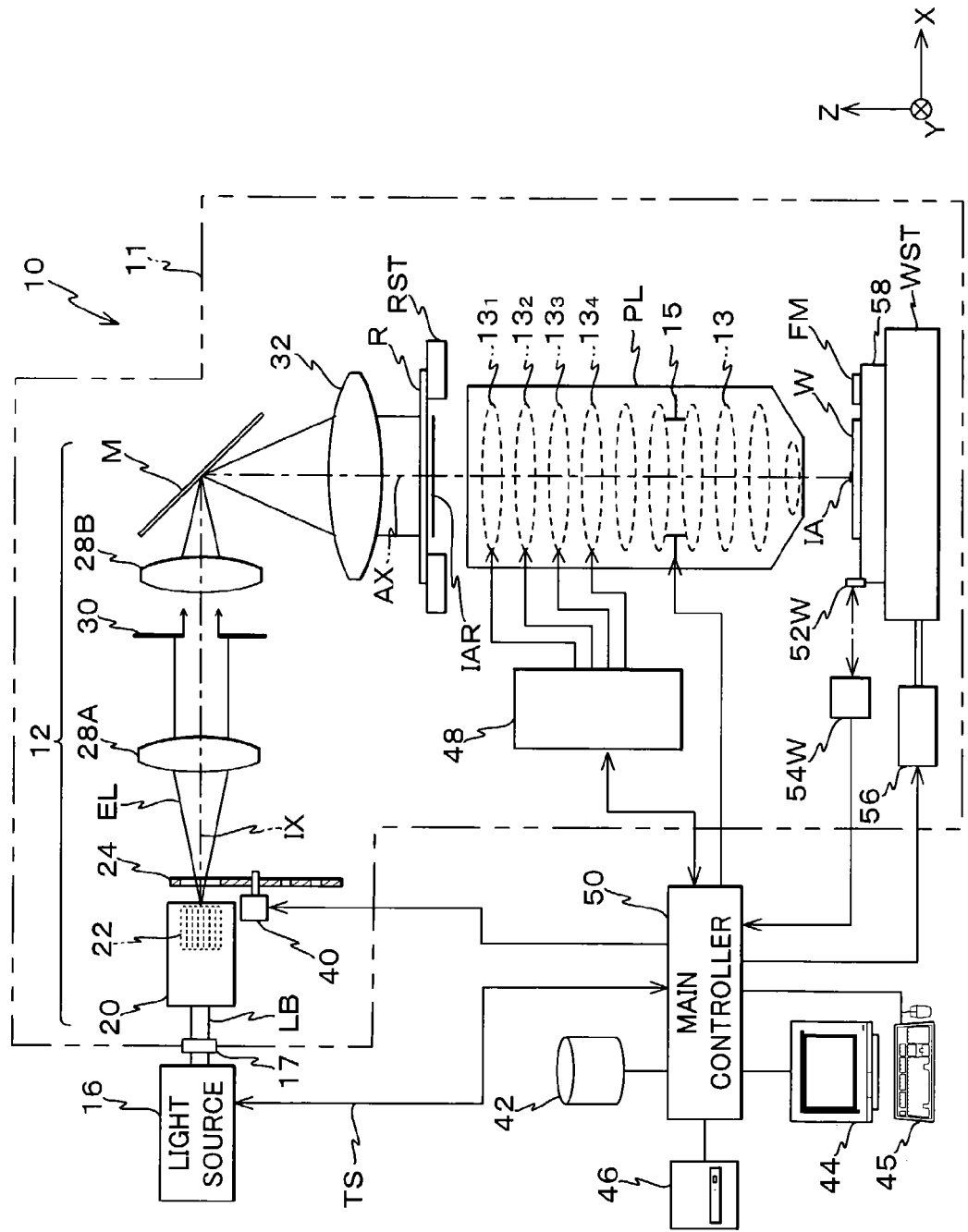
FIG. 1 is a schematic view showing a configuration of an exposure apparatus according to an embodiment of the present invention.

FIG. 1 shows an entire structure of an exposure apparatus 10 according to an embodiment of the present invention. Exposure apparatus 10 is a reduction projection exposure apparatus based on a step-and-repeat method, or a so-called stepper, which uses a pulse-laser light source as an exposure light source (hereinafter, called a "light source").

Exposure apparatus 10 comprises: an illumination system made up of a light source 16 and an illumination optical system 12; a reticle stage RST which serves as a mask stage holding a reticle R serving as a mask, which is illuminated with exposure illumination light EL serving as an energy beam from the illumination system; a projection optical system PL which projects exposure illumination light EL emitted from reticle R onto a wafer W (on the image plane) serving as a substrate; a wafer stage WST serving as a substrate stage on which a Z-tilt stage 58 for holding wafer W is mounted; and a control system for controlling the above parts.

Light source 16 is a pulse-ultraviolet light source that emits pulse light having a wavelength in the vacuum-ultraviolet range, such as an $F_2$ laser (a wavelength of 157 nm) or an ArF laser (a wavelength of 193 nm). Alternatively, light source 16 may be a light source that emits pulse light having a wavelength in the far-ultraviolet or ultraviolet range such as a KrF excimer laser (a wavelength of 248 nm).

In actual, light source 16 is arranged in a service room that has a low degree of cleanliness, different from a clean room where a chamber 11 is arranged. In chamber 11, an exposure apparatus main body is housed that is made up of parts such as various elements of illumination optical system 12, reticle stage RST, projection optical system PL, and wafer stage WST, and light source 16 is connected to chamber 11 via a light-transmitting optical system (not shown). The light transmitting optical system includes at least an optical axis adjusting optical system called a beam-matching unit as a part of its system. An internal controller of the apparatus controls the on/off of the output of laser beam LB, the energy of laser beam LB per pulse, oscillation frequency (repetition frequency), the center wavelength and half band width in spectrum (width of the wavelength range) and the like of light source 16, according to control information TS from a main controller 50.

Illumination optical system 12 comprises: a beam-shaping illuminance uniformity optical system 20 which includes parts such as a cylinder lens, a beam expander (none are shown), an optical integrator (homogenizer) 22; an illumination system aperture stop plate 24; a first relay lens 28A; a second relay lens 28B; a reticle blind 30; a mirror M for deflecting the optical path; a condenser lens 32, and the like. As the optical integrator a fly-eye lens, a rod integrator (internal reflection type integrator) or a diffracting optical element can be used. In this embodiment, since a fly-eye lens is used as optical integrator 22, it will be referred to as fly-eye lens 22 hereinafter.

Beam shaping illuminance uniformity optical system 20 is connected to the light transmitting optical system (not shown), via a light transmission window 17 provided on the chamber 11. It shapes the cross section of laser beam LB, which is emitted from light source 16 and enters beam shaping illuminance uniformity optical system 20 via light transmission window 17, using parts such as the cylinder lens and beam expander. Fly-eye lens 22 in the exit side of beam shaping illuminance uniformity optical system 20 forms a surface light source (a secondary light source), which is made up of a large number of point light sources on the focal plane on the exit side arranged so that it substantially coincides with the pupil plane of illumination optical system 12, with the laser beam that has its cross section shaped, in order to illuminate reticle R with uniform illuminance distribution. The laser beam emitted from the secondary light source is hereinafter referred to as "illumination light EL".

In the vicinity of the focal plane on the exit side of fly-eye lens 22, illumination system aperture stop plate 24 constituted by a disk-like member is disposed. And, on illumination system aperture stop plate 24, for example, an aperture stop (conventional stop) constituted by a circular opening, an aperture stop (a small σ stop) for making coherence factor σ small which is constituted by a small, circular opening, a ring-like aperture stop (annular stop) for forming a ring of illumination light, and a modified aperture stop for modified illumination composed of a plurality of openings disposed in an eccentric arrangement are arranged at a substantially equal angle (only two types of aperture stops are shown in FIG. 1). Illumination system aperture stop plate 24 is constructed and arranged to be rotated by a driving unit 40, for example a motor, controlled by main controller 50, and one of the aperture stops is selectively set to be on the optical path of the illumination light EL, so that the shape of the illuminant surface in Koehler illumination described later is limited to a ring, a small circle, a large circle, four eyes or the like.

Instead of, or in combination with aperture stop plate 24, for example, an optical unit comprising at least one of a plurality of diffracting optical elements, a movable prism (conical prism, polyhedron prism, etc.) which moves along the optical axis of the illumination optical system, and a zoom optical system can be arranged in between light source 16 and optical integrator 22. And by changing the intensity distribution of the illumination light on the incident surface when the optical integrator 22 is a fly-eye lens, or the range of incident angle of the illumination light to the incident surface when the optical integrator 22 is an internal surface reflection type integrator, light amount distribution (the size and shape of the secondary illuminant) of the illumination light on the pupil plane of the illumination optical system, or in other words, the loss of light due to the change of conditions for illuminating reticle R, is preferably suppressed. In addition, in the embodiment, a plurality of light source images (virtual images) formed by the internal surface reflection type integrator is also referred to as the secondary light source.

On the optical path of illumination light EL emitted from illumination system aperture stop plate 24, a relay optical system is arranged that is made up of the first relay lens 28A and the second relay lens 28B, with reticle blind 30 disposed in between. Reticle blind 30 is disposed on a plane conjugate to the pattern surface of reticle R, and forms a rectangular opening to set a rectangular illumination area IAR on reticle R. In this case, a movable blind that has a variable opening shape is used as reticle blind 30, and the opening is set by main controller 50 based on blind setting information, which is also called masking information.

On the optical path of the illumination light EL after the second relay lens 28B making up the relay optical system, deflecting mirror M is disposed for reflecting illumination light EL having passed through the second relay lens 28B toward reticle R. And, on the optical path of illumination light EL after mirror M, condenser lens 32 is disposed.

In the structure described above, the incident surface of fly-eye lens 22, the plane on which the reticle blind 30 is disposed, and the pattern surface of reticle R are set optically conjugate to one another, whereas the light source surface formed on the focal plane on the exit side of fly-eye lens 22 (the pupil plane of the illumination optical system) and the Fourier transform plane of projection optical system PL (the exit pupil plane) are set optically conjugate to each other, so as to form a Koehler illumination system.

The operation of illumination optical system 12 that has the structure described above will be briefly described below. Laser beam LB emitted in pulse from light source 16 enters beam shaping illuminance uniformity optical system 20, which shapes the cross section of the beam. The beam then enters fly-eye lens 22, and the secondary light source is formed on the focal plane on the exit side of fly-eye lens 22.

When illumination light EL emitted from the secondary light source passes through one of the aperture stops on illumination system aperture stop plate 24, it then passes through the rectangular aperture of the reticle blind 30 via the first relay lens 28A, and then passes through second relay lens 28B and is deflected vertically downward by mirror M. Then, after passing through condenser lens 32, illumination light EL illuminates the rectangular illumination area IAR on reticle R held on reticle stage RST with uniform illuminance.

On reticle stage RST, reticle R is mounted and held by electrostatic chucking (or by vacuum chucking) or the like (not shown). Reticle stage RST is structured so that it can be finely driven (and rotated) on a horizontal plane (an XY plane) by a driving system (not shown). In addition, reticle stage RST can be moved in the Y-axis direction within a predetermined stroke range (of around the length of reticle R). The position of reticle stage RST is measured by a position detector, such as a reticle laser interferometer, at a resolution of, for example, 0.5 to 1 nm, and the measurement results are supplied to main controller 50.

Material used for reticle R depends on the light source used. More particularly, when an ArF excimer laser or KrF excimer laser is used as the light source, synthetic quartz, fluoride crystal such as fluorite, fluorine-doped quartz or the like can be used, whereas, when an $F_2$ laser is used as the light source, the material used for reticle R needs to be fluoride crystal such as fluorite, fluorine-doped quartz or the like.

Projection optical system PL is, for example, a reducing system that is double telecentric, and the projection magnification of projection optical system PL is, e.g., ¼, ⅕ or ⅙. Therefore, when illumination area IAR on reticle R is illuminated with illumination light EL in the manner described above, the image of the pattern formed on reticle R is reduced by the above projection magnification via projection optical system PL, and then is projected and transferred onto a rectangular area IA (normally coincides with the shot area) on wafer W coated with a resist (photosensitive material).

Projection optical system PL is a dioptric system composed only of a plurality of refracting optical elements (lenses) 13, such as around 10 to 20, as is shown in FIG. 2. Of the plurality of lenses 13 making up projection optical system PL, a plurality of lenses $13_1$, $13_2$, $13_3$, $13_4$ (in this case, for the sake of simplicity, there are four lens devices) in the object-plane side (reticle R side) are movable lenses, which can be driven externally by an image forming characteristics correction controller 48. Lens holders (not shown) hold lenses $13_1$, $13_2$, $13_4$, respectively, and these lens holders are supported in the gravitational direction at three points by driving devices such as piezo elements (not shown). And, by independently adjusting the applied voltage to the driving devices, the lenses $13_1$, $13_2$, $13_4$ can be shifted in a Z-axis direction, which is the optical axis direction of projection optical system PL, and can be driven (tilted) in a direction of inclination relative to the XY plane (that is, a rotational direction around the X-axis and a rotational direction around the Y-axis). In addition, a lens holder (not shown) holds lens $13_3$, and on the periphery of the lens holder, driving devices such as piezo elements are disposed at a substantially equal angle of, for example, 90 degrees. The opposing driving devices are paired, and the applied voltage to each pair is adjusted so that lens $13_3$ can be shifted two-dimensionally in the XY plane. In this embodiment, lenses $13_1$, $13_2$, $13_3$, and $13_4$ each structure a specific optical element for adjustment. Specific optical elements are not limited to lenses $13_1$, $13_2$, $13_3$, $13_4$, and may include lenses disposed near the pupil plane or the image plane of projection optical system PL, or an aberration correcting plate (optical plate) for correcting the aberration of projection optical system PL, especially the non-rotational symmetric component. Furthermore, the degree of freedom (the number of movable directions) of the specific optical elements is not limited to two or three, but may be one or four and over.

In addition, an aperture stop 15 is provided near the pupil plane of projection optical system PL, and the numerical aperture (N.A.) of aperture stop 15 is variable continuously in a predetermined range. As aperture stop 15, for example, a so-called iris aperture stop is used, and main controller 50 controls aperture stop 15.

When an ArF excimer laser or KrF excimer laser is used as the illumination light EL, the material for each of the lens elements used in the projection optical system PL can be synthetic quartz, however, when an $F_2$ laser is used, the material of the lenses used all has to be fluoride crystal such as fluorite, or fluorine-doped quartz referred to earlier.

Wafer stage WST is structured freely drivable on the XY two-dimensional plane by a wafer-stage driving portion 56. And wafer W is held on a Z-tilt stage 58 mounted on wafer stage WST by electrostatic chucking, vacuum chucking or the like, via a wafer holder (not shown). Z-tilt stage 58 adjusts the position of wafer W in the Z-direction (focus position) and the angle of inclination of wafer W with respect to the XY plane. In addition, the X- and Y-positions and rotation (including yawing, pitching and rolling) of wafer stage WST is measured with a wafer laser interferometer 54W externally disposed via a movable mirror 52W, which is fixed on Z-tilt stage 58. The measurement values of wafer laser interferometer 54W are supplied to main controller 50.

In addition, a reference mark plate FM on which reference marks such as those for base-line measurement are formed is fixed on Z-tilt stage 58 so that the surface of reference mark plate FM is substantially the same height as the surface of wafer W.

In the exposure apparatus 10 in the embodiment, although it is omitted in the drawings, a pair of reticle alignment microscopes is provided above reticle R, each constituted by a TTR (Through The Reticle) alignment optical system. With this system, the exposure wavelength is used to observe a reticle mark 2 on reticle R and a reference mark on the reference mark plate at the same time, via projection optical system PL. As such reticle alignment microscopes, microscopes that have a similar structure to the ones disclosed in, for example, Japanese Patent Application Laid-Open No. 07-176468 and the corresponding U.S. Pat. No. 5,646,413, are used. As long as the national laws in designated states or elected states, to which this international application is applied, permit, the above disclosures are incorporated herein by reference.

In addition, in the embodiment, although it is omitted in the drawings, the position of wafer W in the Z-direction is measured with a focus detection sensor constituted by a multiple focal point position detection system, which details are disclosed in, for example, Japanese Patent Application Laid-Open No. 06-283403 and its corresponding U.S. Pat. No. 5,448,332. The output of this focus sensor is supplied to main controller 50, which performs so-called focus-leveling by controlling Z-tilt stage 58. As long as the national laws in designated states or elected states, to which this international application is applied, permit, the above disclosures are incorporated herein by reference.

Furthermore, an alignment system based on an off-axis method is provided (not shown) on the side surface of projection optical system PL. As such a system, for example, a microscope of an FIA (Field Image Alignment) system based on an image-processing method is used. In this system, for example, a broadband detection beam that does not expose the resist on the wafer is irradiated on a target mark, an image of the target mark formed on the photodetection surface by the reflection light from the target mark and an index image are picked up with a pick-up device (such as a CCD), and the imaging signals are output. And, based on the output of the alignment system, the position of the reference marks on reference mark plate FM and alignment marks on the wafer can be measured in the XY two-dimensional directions.

In the control system in FIG. 1, main controller 50 plays the main role. Main controller 50 is made up of a so-called workstation (or microcomputer) comprising a CPU (Central Processing Unit), ROM (Read Only Memory), RAM (Random Access Memory), or the like, and controls overall operations such as the stepping of wafer stage WST in between shots and the exposure timing so that exposure operations are appropriately performed.

In addition, in the embodiment, for example, a storage unit 42 made up of hard disks, an input unit 45 comprising a key board and a pointing-device such as a mouse, a display unit 44 such as a CRT display or liquid-crystal display, and a drive unit 46 which is an information recording medium such as CD-ROM, DVD-ROM, MO, or FD are externally connected to main controller 50. In the information recording medium (hereinafter described as CD-ROM for the sake of convenience) set in drive unit 46, a conversion program (a first program), a second program, a third program, and data associated with the second program are stored. In this case, the first program is a conversion program for converting positional deviations measured using a measurement reticle $R_T$, which will be described later, into coefficients of each term of the Zernike polynomial, the second program is a program for computing the adjustment amount of the image forming characteristic based on the obtained coefficients of each term of the Zernike polynomial, and the third program is a program for converting the obtained coefficients of each term of the Zernike polynomial into various image forming characteristics (including index values of the image forming characteristics).

Next, the above database will be described. The database contains numerical data of parameters for calculating an image forming characteristic, in this case, a targeted drive amount (targeted adjustment amount) of movable lenses $13_1$, $13_2$, $13_3$, and $13_4$ referred to earlier, so that the image forming characteristic is adjusted according to the input of measurement results of the wavefront aberration. The database consists of a group of data on a variation amount of the image forming characteristic, which are obtained as simulation results, arranged in a predetermined order. The simulation performed uses a model substantially equivalent to projection optical system PL, and obtains data on how the image forming characteristic corresponding to a plurality of measurement points within the field of projection optical system PL change when movable lenses $13_1$, $13_2$, $13_3$, and $13_4$ are driven by a unit adjustment quantity in directions of each degree of freedom (movable directions), or more specifically, obtains wavefront data, that is, data on how the coefficients of the second term through the $37^{th}$ term of the Zernike polynomial change.

Next, the procedure of generating the database will be briefly described. First of all, design values of projection optical system PL (numerical aperture N.A., coherence factor σ, wavelength, data of each lenses or the like) are input into a computer used for the simulation where specific optical software is installed. Then, data on a first measurement point (in this case, a position corresponding to an arbitrary pinhole position of measurement reticle $R_T$, which will be described later) within the field of projection optical system PL are input in the simulation computer.

Next, data on unit quantity of the movable lenses in directions of each degree of freedom (movable directions) is input. However, before the input, conditions that are a prerequisite for the input will be described below.

Figure 2A:
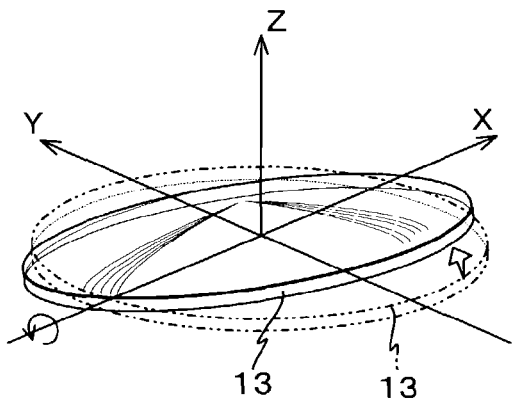
FIGS. 2A to 2F are views for explaining a definition of drive directions of movable lenses or the like that are driven on the making of a data base.
Figure 2B:
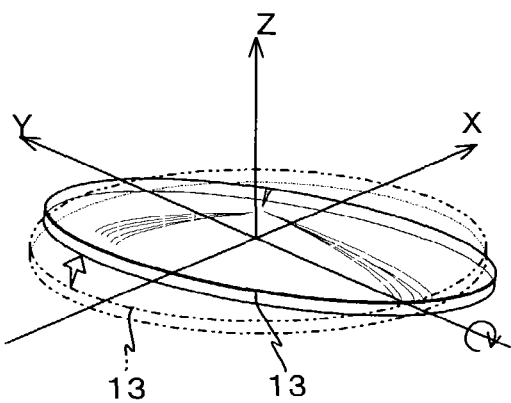
Figure 2C:
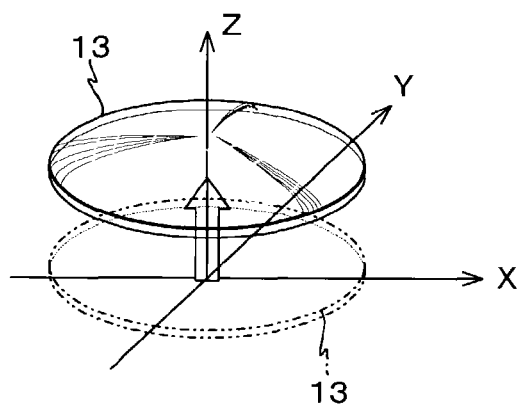

More particularly, for movable lenses $13_1$, $13_2$, and $13_4$, directions in which each of the movable lenses 13 are rotated around the X-axis and Y-axis are to be the positive directions of a Y-direction tilt and an X-direction tilt, as is shown by the arrows in FIGS. 2A and 2B, and the unit tilt amount is to be 0.1 degrees. In addition, when each of the movable lenses 13 are shifted in the +Z direction as is shown in FIG. 2C, the +Z direction is to be the positive direction of the Z-direction shift, and the unit shift amount is to be 100 μm.

Figure 2D:
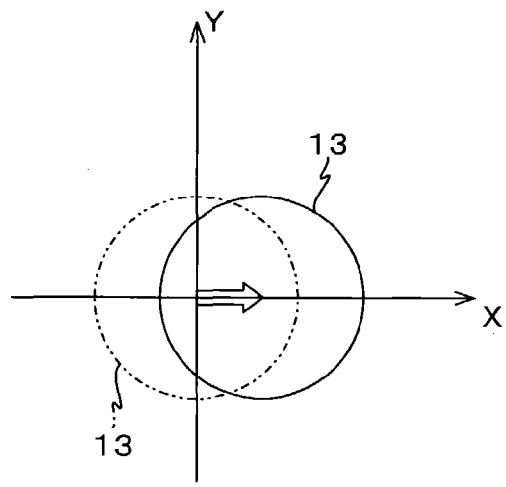
Figure 2E:
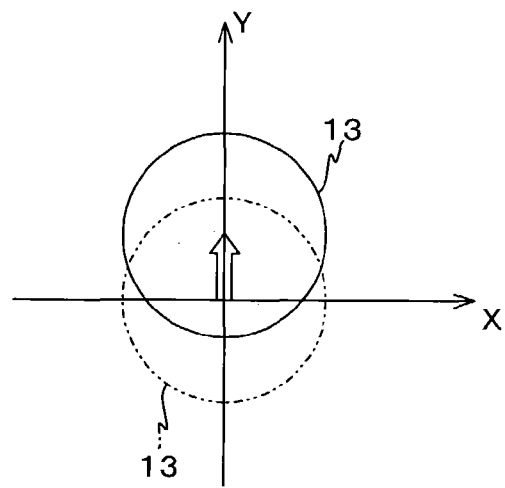

In addition, for movable lens $13_3$, when it is shifted in the +X direction as is shown in FIGS. 2D and 2E, this direction is to be the + (positive) direction of the X-direction shift, whereas when it is shifted in the +Y direction, this direction is to be the + (positive) direction of the Y-direction shift, and the unit shift amount is to be 100 μm And, for example, when instructions to tilt movable lens $13_1$ in the positive direction of the Y-direction tilt by the unit quantity is input, the simulation computer calculates the amount of deviation of a first wavefront from an ideal wavefront at a first measurement point set in advance within the field of projection optical system PL; for example, variation of the coefficients of each term (e.g. the second term through the $37^{th}$ term) of the Zernike polynomial. The data of the variation is shown on the display, while also being stored in memory as parameter PARA1P1.

Next, when instructions to tilt movable lens $13_1$ in the positive direction of the X-direction tilt by the unit quantity is input, the simulation computer calculates the amount of deviation of a second wavefront from the ideal wavefront at the first measurement point, for example, variation of the coefficients of the above terms of the Zernike polynomial, and data on the variation are shown on the display, while also being stored in memory as parameter PARA2P1.

Next, when instructions to shift movable lens $13_1$ in the positive direction of the Z-direction shift by the unit quantity is input, the simulation computer calculates the deviation of a third wavefront from the ideal wavefront at the first measurement point, for example, variation of the coefficients of the above terms of the Zernike polynomial, and data on the variation are shown on the display, while also being stored in memory as parameter PARA3P1.

Then, input for each measurement point from the second measurement point to the $n^{th}$ measurement point is performed in the same procedure as is described above, and each time instructions are input for the Y-direction tilt, the X-direction tilt, and the Z-direction shift of movable lens $13_1$, the simulation computer calculates the data of the first, second, and third wavefront in each measurement point, such as variation of the coefficients of the above terms of the Zernike polynomial, and data on each variation are shown on the display, while also being stored in memory as parameters PARA1P2, PARA2P2, PARA3P2, through PARA1Pn, PARA2Pn, PARA3Pn.

Also for the other movable lenses $13_2$, $13_3$, and $13_4$, in the same procedure as is described above, input for each measurement point is performed and instructions are input for driving movable lenses $13_2$, $13_3$, and $13_4$ in the + direction only by the unit quantity in directions of each degree of freedom. And in response, the simulation computer calculates the wavefront data for each of the first through $n^{th}$ measurement points when movable lenses $13_2$, $13_3$, and $13_4$ are driven only by the unit quantity in directions of each degree of freedom, such as variation of the coefficients of the above terms of the Zernike polynomial, and parameter (PARA4P1, PARA5P1, PARA6P1, . . . PARAmP1), parameter (PARA4P2, PARA5P2, PARA6P2, . . . PARAmP2), . . . up to parameter (PARA4Pn, PARA5Pn, PARA6Pn, . . . PARAmPn) are stored in memory. Then, data of a matrix O given the following expression (1) is stored in the CD-ROM as the above database. The data of matrix O is composed of column matrices (vectors) PARA1P1 up to PARAmPn, which consists of variations of the coefficients of the above terms of the Zernike polynomial. In the embodiment, because there are three movable lenses that can be moved in directions of three degrees of freedom and one movable lens that can be moved in directions of two degrees of freedom, m=3×3+2×1=11.

$$O = \begin{bmatrix} PARA1P1 & PARA2P1 & \Lambda & \Lambda & PARAmP1 \\ PARA1P2 & PARA2P2 & \Lambda & \Lambda & PARAmP2 \\ M & M & & & M \\ M & M & & & M \\ PARA1Pn & PARA2Pn & \Lambda & \Lambda & PARAmPn \end{bmatrix} \Lambda \quad (1)$$

Next, the method of measuring and displaying (simulating) the image forming characteristic will be described so that an operator of exposure apparatus 10 can easily understand the state of aberrations of projection optical system PL. The simulation in the embodiment requires the actual measurement data of the wavefront aberration of projection optical system PL, and when the wavefront aberration is measured, a measurement reticle $R_T$ (hereinafter, also called "reticle $R_T$" as appropriate) is used. Therefore, first of all, measurement reticle $R_T$ will be described.

Figure 3:
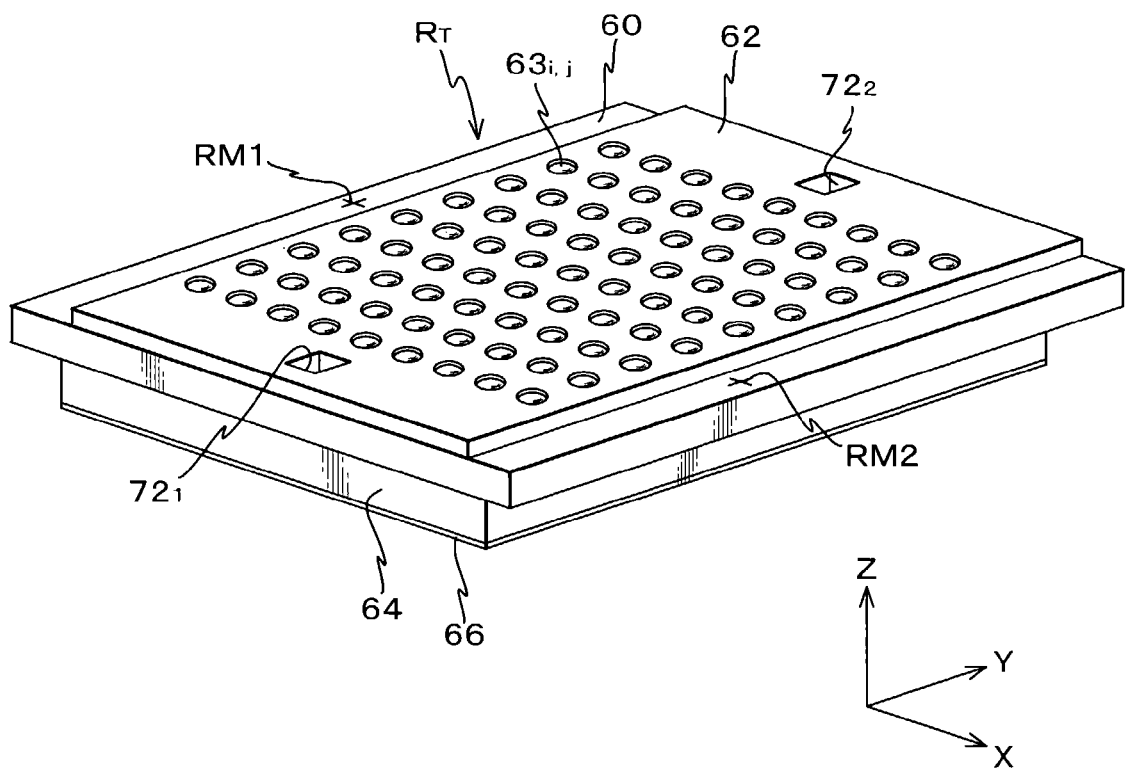
FIG. 3 is a schematic perspective view of a measurement reticle.
Figure 4:
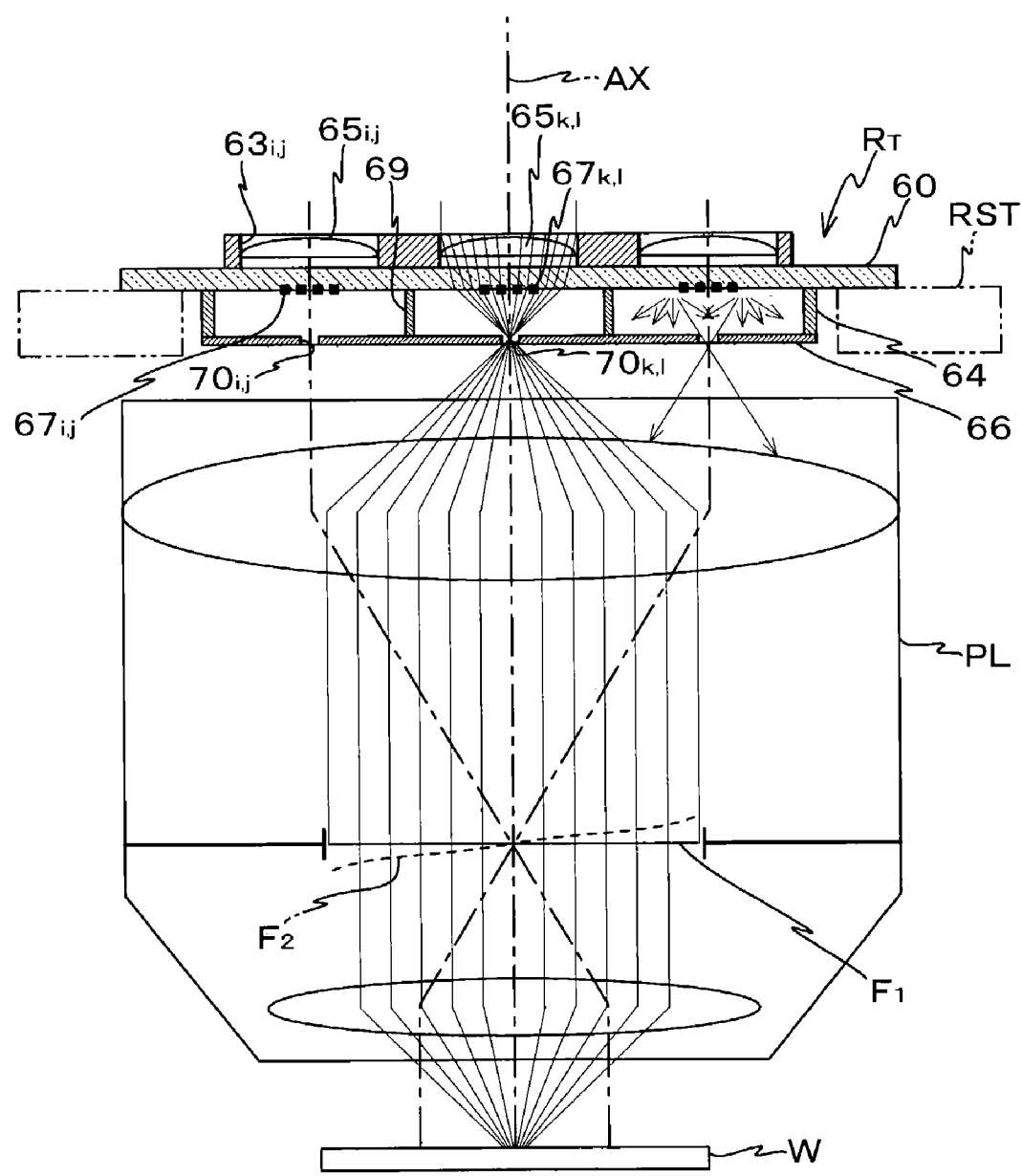
FIG. 4 is a view showing a schematic view of an XZ cross section in the vicinity of an optical axis in a state where a measurement reticle is mounted on a reticle stage, along with a diagram of a projection optical system.
Figure 5:
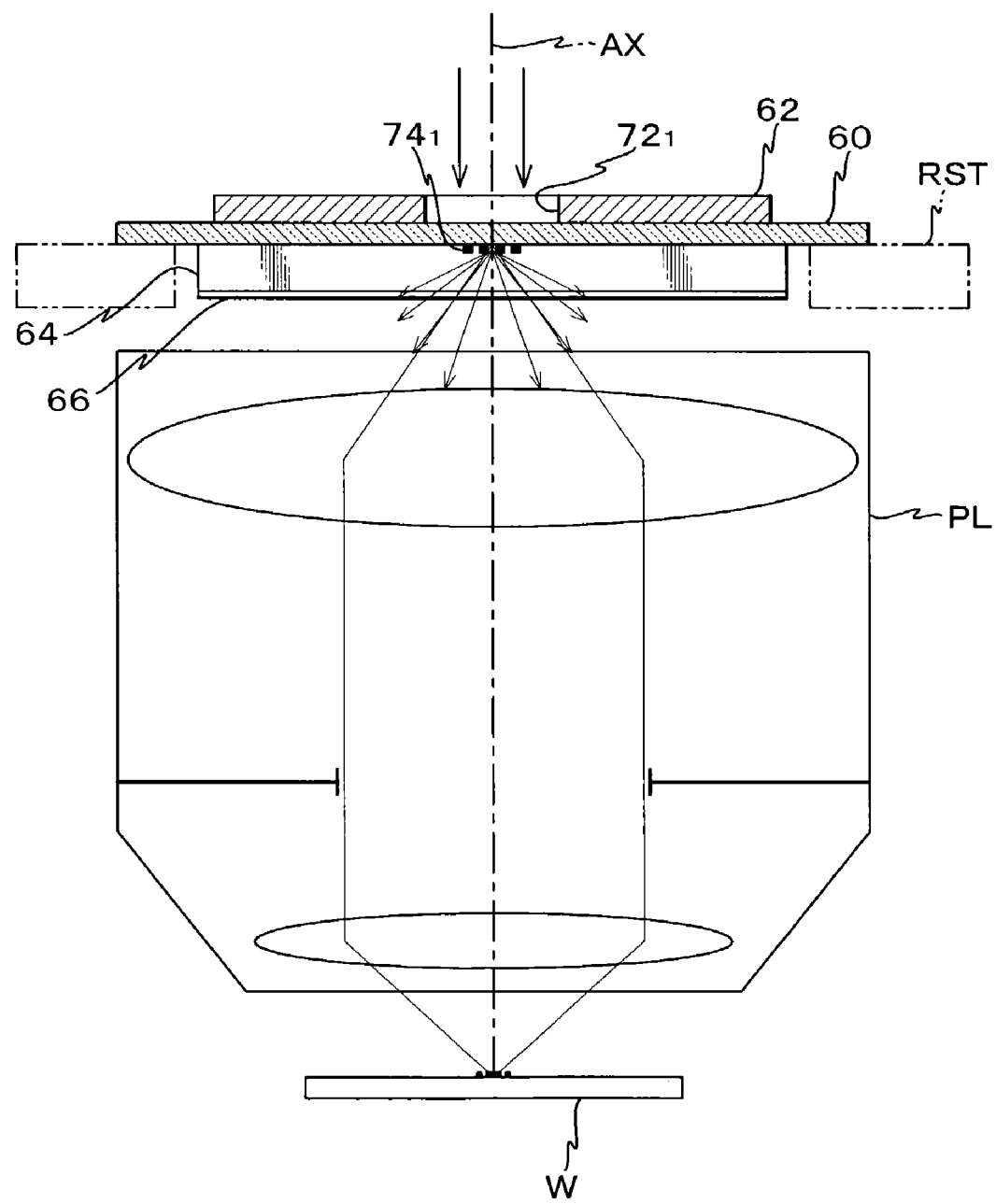
FIG. 5 is a view showing a schematic view of an XZ cross section in the vicinity of a −Y side end portion in a state where a measurement reticle is mounted on a reticle stage, along with a diagram of a projection optical system.

FIG. 3 shows a schematic oblique view of measurement reticle $R_T$. In addition, FIG. 4 shows a schematic view of reticle $R_T$ mounted on the reticle stage RST sectioned along a X-Z plane in the vicinity of optical axis AX, along with a diagram of projection optical system PL. Also, FIG. 5 shows a schematic view of reticle $R_T$ mounted on the reticle stage RST sectioned along a X-Z plane in the vicinity of the −Y side end, along with a diagram of projection optical system PL.

As is obvious in FIG. 3, the shape of measurement reticle $R_T$ is almost the same as an ordinary reticle with a pellicle. Measurement reticle $R_T$ comprises a glass substrate 60, a lens-attached member 62 which has a rectangular plate-like shape and is fixed on the upper surface of glass substrate 60 in FIG. 3 at the center in the X-axis direction, a spacer member 64 made up of a frame member that has the same shape as an ordinary pellicle frame, being fixed on the bottom surface of the glass substrate 60 in FIG. 3, and an aperture plate 66 fixed on the bottom surface of spacer member 64.

In the lens-attached member 62, n circular apertures $63_{i,j}$ (i=1 through p, j=1 through q, p×q=n) are formed in a matrix arrangement, covering the entire surface excluding both ends in the Y-direction. Inside the circular apertures $63_{i,j}$, condenser lenses $65_{i,j}$ are provided that are each made of a convex lens having an optical axis in the Z-axis direction (refer to FIG. 4).

In addition, inside the space enclosed by glass substrate 60, spacer member 64, and aperture plate 66, reinforcing members 69 are provided as is shown in FIG. 4, spaced a predetermined distance apart.

Furthermore, on the lower surface of the glass substrate 60, facing condenser lenses $65_{i,j}$, measurement patterns $67_{i,j}$ are formed as is shown in FIG. 4. In addition, in aperture plate 66, pinhole-shaped openings $70_{i,j}$ are formed, each facing measurement patterns $67_{i,j}$ as is shown in FIG. 4. The diameter of pinhole-shaped openings $70_{i,j}$ is, for example, around 100 to 150 μm.

Referring back to FIG. 3, in lens-attached member 62, openings $72_1$, $72_2$ are formed, respectively, in the center of strip shaped areas on both ends of lens-attached member 62 in the Y-axis direction. As is shown in FIG. 5, on the bottom surface (pattern surface) of glass substrate 60, a reference pattern $74_1$ is formed opposing opening $72_1$. Also, although it is omitted in the drawing, a reference pattern $74_2$ identical to reference pattern $74_1$ is formed opposing the other opening $72_2$ on the bottom surface (pattern surface) of glass substrate 60.

Moreover, as is shown in FIG. 3, on the X-axis that passes through the center of reticle R, a pair of reticle alignment marks RM1 and RM2 is formed symmetrically with respect to the center of the reticle, on the glass substrate 60 outside lens-attached member 62.

Figure 6A:
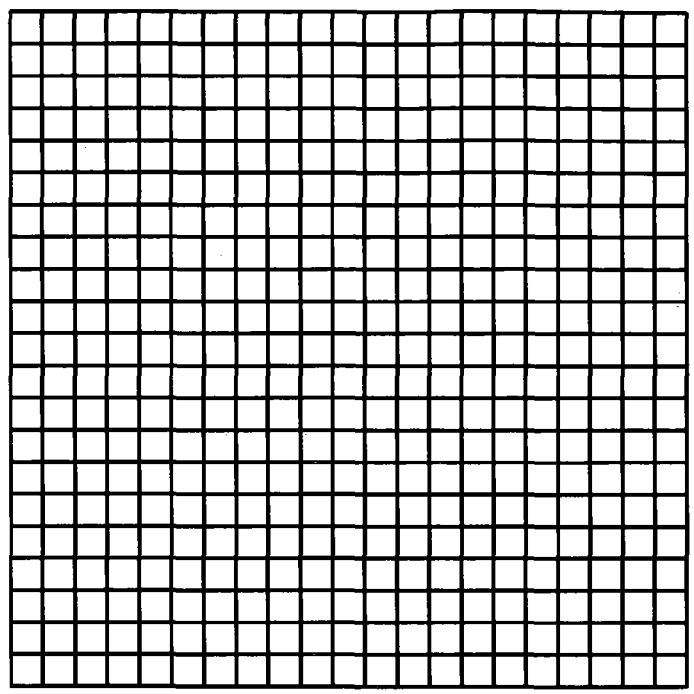
FIGS. 6A and 6B are views showing a measurement pattern and a reference pattern formed on the measurement reticle in this embodiment, respectively.
Figure 6B:
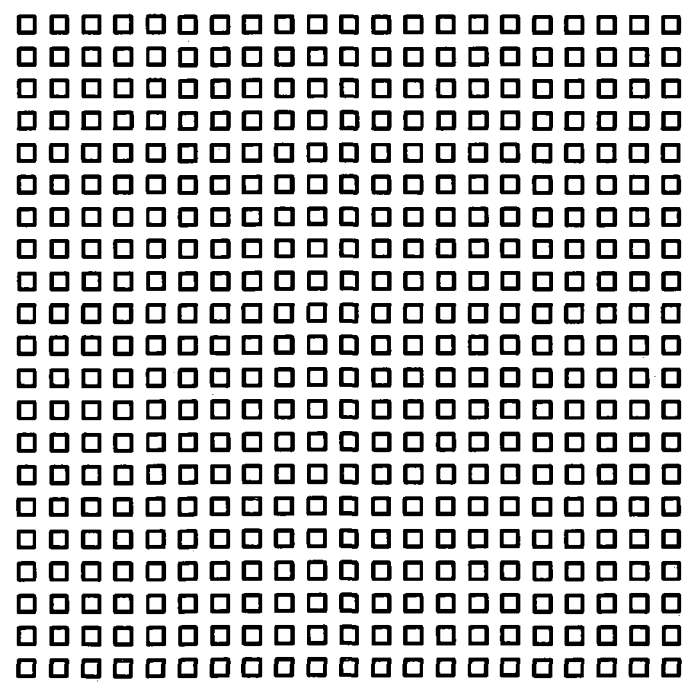

In the embodiment, as measurement patterns $67_{i,j}$, a mesh (street-line shaped) pattern is used, as is shown in FIG. 6A. And, corresponding to the pattern, reference patterns $74_1$ and $74_2$ are a two-dimensional grid pattern that has square patterns arranged at the same pitch as measurement pattern $67_{i,j}$ in FIG. 6B. As reference patterns $74_1$ and $74_2$, the pattern shown in FIG. 6A can be used, and the pattern shown in FIG. 6B can be used as the measurement pattern. Furthermore, patterns that have other shapes may be used as the measurement pattern $67_{i,j}$, and in such a case, as the corresponding reference pattern, a pattern having a predetermined positional relation with the measurement pattern has to be used. That is, the reference pattern only needs to be a pattern, which is a reference for positional deviation of the measurement pattern, regardless of the shape. However, in order to measure the image forming characteristic of projection optical system PL, a pattern that covers the entire image field of projection optical system PL or the entire exposure area is preferred.

Next, the method of measuring and displaying (simulating) image forming characteristics will be described so that an operator of exposure apparatus 10 can easily understand the state of aberrations of projection optical system PL, following a flow chart in FIG. 7, which schematically shows the control algorism of the CPU in main controller 50, and referring to other figures when necessary.

As a premise, the CD-ROM containing the first through third programs and the database is set in drive unit 46, and from the CD-ROM, the first through third programs are to be installed in storage unit 42.

The process in the flow chart starts when the operator inputs the instructions to start the simulation via the input unit 45.

First, in step 101, the third program is loaded into the main memory. Then, steps 102 through 122 are executed, according to the third program.

First, in step 102, when the screen for setting conditions is displayed on the display unit 44, the process then goes to step 104 and waits for the conditions to be input. The operator then inputs information on a pattern subject to simulation (for example, in the case of a line-and-space pattern, the pitch, the line width, and duty ratio or the like) and information on a targeted image forming characteristic (including an index value of the image forming characteristic; the targeted image forming characteristic also hereinafter referred to as "targeted aberration" as appropriate) such as information on a line width abnormal value, via input unit 45. Then, when instructions are given that the input is complete, the process proceeds to step 106, where conditions are set for creating a Zernike sensitivity table of the targeted aberration input in step 104, and the step then proceeds to step 108. The information on targeted aberration entered in step 104 is not limited to one kind. That is, various kinds of image forming characteristics of projection optical system PL can be designated as the targeted aberration at the same time.

In step 108, when the screen for inputting information on the projection optical system is displayed on display unit 44, the process then goes to step 110 and waits for the information to be input. And after the operator inputs information on projection optical system PL, specifically information on the numerical aperture (N.A.), illumination conditions (such as setting of the illumination system aperture stop or coherence factor σ), wavelength or the like via input unit 45, the process goes to step 112, where the input information is stored in the RAM and when the screen for inputting information on the aberration is displayed on display unit 44, the procedure moves on to step 114 and waits for the information to be input.

The operator then individually inputs information on a given aberration, or to be more specific, individually inputs the same value, such as 0.05λ, into the input screen for aberration information for the coefficient values of each term of the Zernike polynomial when they are, for example, coefficient $Z_2$ of the second term up to coefficient $Z_{37}$ of the $37^{th}$ term.

When input of the above aberration is complete, the process proceeds to step 116, where a graph is made (for example, a Zernike sensitivity table on a line width abnormal value), based on the information of aberration that has been input. For example, the vertical axis of the map can be a targeted aberration corresponding to the 0.05λ or its index value (such as the line width abnormal value, which is the index value of coma), and the horizontal axis can be the coefficients of each term of the Zernike polynomial. The process then proceeds to step 118, where the screen for confirming the completion of the above graph is displayed on display unit 44.

In the next step, step 120, operation is suspended until the operator inputs the confirmation. When the operator inputs the confirmation via input unit 45 such as the mouse, the process then proceeds to step 122, where the variation table made in the above step 116 is stored in the RAM, and the decision is made whether or not the Zernike sensitivity table is made for all the targeted aberrations input in step 104. When the decision in step 122 is negative, the process then returns to step 116 to make a Zernike sensitivity table and for the next targeted aberration. In the embodiment, one variation table is made for one targeted aberration without changing any conditions such as the numerical aperture of projection optical system PL or the illumination conditions, however, for example, a plurality of variation tables may be made for one targeted aberration changing at least either the numerical aperture of projection optical system PL or the illumination conditions. In addition, the pattern subject to simulation may be in plurals, and the variation table for the target aberration may be made per pattern.

When the Zernike sensitivity table has been made for all the targeted aberrations and the confirmation has been input in step 120, the decision turns positive in step 122 and the process proceeds to the next step, step 124.

In step 124, the decision is made whether a flag F is "1" or not. Flag F indicates whether data of positional deviations (Δξ, Δη), which will be described later, has been input. In this case, because data of the positional deviations (Δξ, Δη) has not been input, the decision is negative, which takes the process to a measuring subroutine 126, where wavefront aberration is measured using measurement reticle $R_T$ at a plurality of measurement points (hereinafter, n) in the field of projection optical system PL in the following manner.

Figure 8:
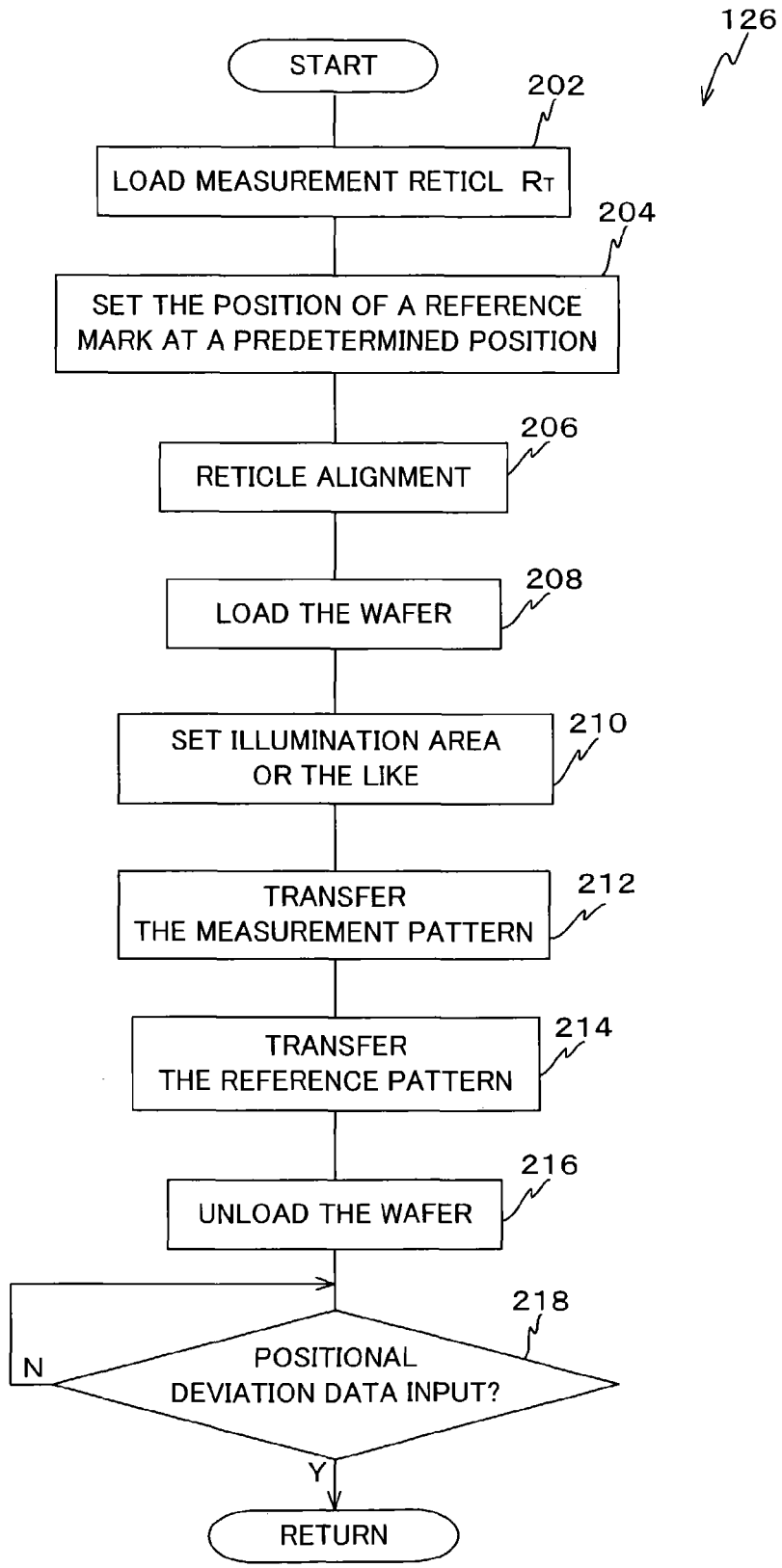
FIG. 8 is a flow chart showing a processing in subroutine 126 of FIG. 7.

That is, in subroutine 126, first of all, in step 202 in FIG. 8, measurement reticle $R_T$ is loaded onto reticle stage RST via a reticle loader (not shown).

In the next step, step 204, wafer stage WST is moved via the wafer-stage driving portion 56 while the output of laser interferometer 54W is being monitored, and a pair of reticle alignment reference marks formed on reference mark plate FM is positioned at a predetermined reference position. The reference position, in this case, is set so that, for example, the center of the pair of reference marks coincides with the origin of the stage coordinate system set by laser interferometer 54W.

In step 206, the pair of reticle alignment marks RM1 and RM2 formed on measurement reticle $R_T$ and the corresponding reticle alignment reference marks are observed with the reticle alignment microscopes at the same time, and reticle stage RST is finely driven in the XY two-dimensional plane via a driving system (not shown) so as to make positional deviations minimal between projected images of reticle alignment marks RM1 and RM2 on reference plate FM and the reticle alignment reference marks. With this operation, reticle alignment is completed, and the center of the reticle substantially coincides with the optical axis of projection optical system PL.

In the next step, step 208, wafer W is loaded onto Z-tilt stage 58 via a wafer loader (not shown). The surface of wafer W is coated with a resist (photosensitive material).

In the next step, step 210, the aperture size of reticle blind 30 is set so that a rectangular shaped illumination area is formed to cover the entire surface of measurement reticle $R_T$ including all the condenser lenses $65_{i,j}$, with the exception of openings $72_1$, $72_2$, and the length of the illumination area in the X-axis direction length is within the maximum width of the X-axis direction of lens-attached member 62. In addition, at the same time, illumination system aperture stop plate 24 is rotated via driving unit 40 to set a predetermined aperture stop, such as the small σ stop, to the optical path of illumination light EL. With this operation, the preparatory operations for exposure are completed.

Figure 9A:
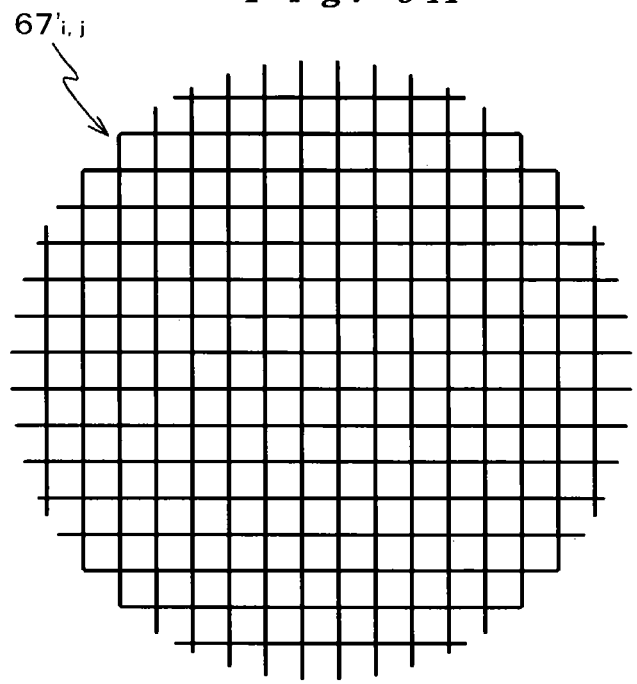
FIG. 9A is a view showing a reduced image (latent image) of the measurement pattern formed at a predetermined spacing on the resist layer of a wafer.

In the next step, step 212, control information TS is given to light source 16 so that laser beam LB is generated, and exposure is performed by irradiating reticle $R_T$ with illumination light EL. With this operation, measurement patterns $67_{i,j}$ are each simultaneously transferred via pinhole-like openings $70_{i,j}$ and projection optical system PL, as is shown in FIG. 4. As a result, reduced images $67'_{i,j}$ (latent images) of measurement patterns $67_{i,j}$ as is shown in FIG. 9A are formed two-dimensionally on the resist layer of wafer W, spaced apart at a predetermined distance.

In the next step, step 214, the reference pattern is sequentially overlaid and transferred onto the images of the measurement patterns already formed on wafer W by a step-and-repeat method. Following are the details of the sequence, from a. through g.

a. First, reticle stage RST is driven in the Y-axis direction by a predetermined distance via a driving system (not shown), so that the center of reference pattern $74_1$ coincides with optical axis AX, based on the measurement values of a reticle laser interferometer (not shown) and the designed positional relation between the center of the reticle and reference pattern $74_1$.

b. Next, when the above movement is completed, the aperture of reticle blind 30 is set via a driving system (not shown) so that the illumination area of illumination light EL is set limited to a rectangular area having a predetermined size, on the lens-holding member 62 including opening $72_1$ (but does not include any condenser lenses).

c. Next, wafer stage WST is moved so that the center of the area where latent image $67'_{1,1}$ of the first measurement pattern $67_{1,1}$ is formed on wafer W is positioned substantially on optical axis AX, while the measurement values of laser interferometer 54W are monitored.

d. Then, main controller 50 gives control information TS to light source 16 for generating laser beam LB, and performs exposure by irradiating illumination light EL on reticle $R_T$. With this operation, reference pattern $74_1$ is overlaid and transferred onto the area where the latent image of measurement pattern $67_{1,1}$ is already formed (referred to as area $S_{1,1}$) on the resist layer of wafer W. As a result, the latent image $67'_{1,1}$ of the first measurement pattern $67_{1,1}$ and the latent image $74'_1$ of the reference pattern $74_1$ are formed on area $S_{1,1}$ in a positional relation shown in FIG. 9B.

e. Next, a designed arrangement pitch p of measurement patterns $67_{i,j}$ on wafer W is calculated, based on an arrangement pitch of measurement patterns $67_{i,j}$ on reticle $R_T$ and the projection magnification of projection optical system PL. Then, wafer stage WST is moved in the X-axis direction by pitch p so that the center of an area $S_{1,2}$ where the latent image of the second measurement pattern $67_{1,2}$ is formed substantially coincides with optical axis AX.

f. Then, control information TS is given to light source 16 so that laser beam LB is emitted and exposure is performed by irradiating illumination light EL on reticle $R_T$. With this operation, reference pattern $74_1$ is overlaid and transferred onto area $S_{1,2}$ on wafer W.

g. Hereinafter, stepping operations between areas and exposure operation are repeated in the manner described above, and latent images of the measurement patterns and the reference pattern are formed in areas $S_{i,j}$ on wafer W, as shown is in FIG. 9B.

When exposure is completed in this manner, the process goes to step 216, where wafer W is unloaded from Z-tilt stage 58 via the wafer loader (not shown) and is transferred to a coater-developer (not shown; hereinafter, "C/D" for short), which is connected in line with chamber 11. The process then proceeds to step 218, where data of positional deviations (Δξ, Δη), which will be described later, will be input.

Figure 9B:
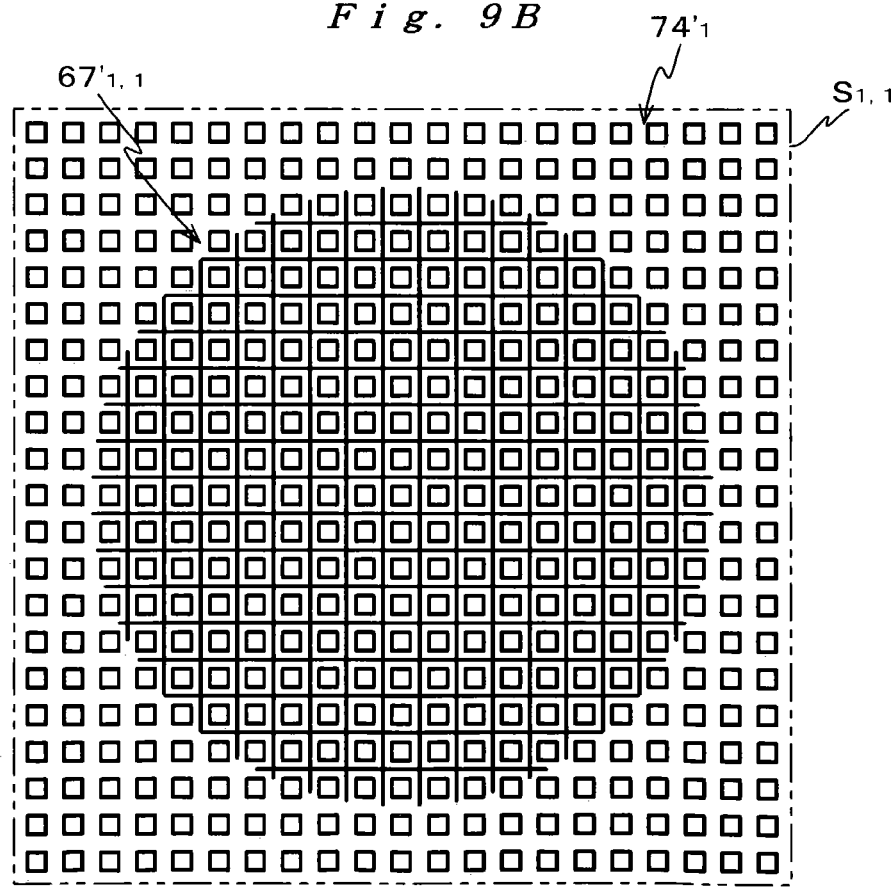
FIG. 9B is a view showing a positional relation between the latent image of the measurement pattern in FIG. 9A and a latent image of a reference pattern.

Then, in the C/D, wafer W is developed, and the resist images of the measurement pattern and the reference pattern are formed on wafer W in the same arrangement as shown in FIG. 9B, in each of the areas $S_{i,j}$ arranged in a matrix.

Then, wafer W that has been developed is removed from the C/D, and overlay errors are measured in each of the areas $S_{i,j}$ by an external overlay measuring unit (registration measuring unit). And, based on the results, positional errors (positional deviations) of the resist images of measurement patterns $67_{i,j}$ with respect to the corresponding images of reference pattern $74_1$ are calculated.

Various methods of calculating the positional deviations can be considered, however, from the viewpoint of improving accuracy, performing statistical computation based on measured raw data is preferred.

In this manner, the XY two-dimensional positional deviations (Δξ, Δη) of the measurement patterns from the respective reference patterns are obtained for the areas $S_{i,j}$. Then the data on positional deviations (Δξ, Δη) for the areas $S_{i,j}$ is input by an operator via input unit 45. And, when the decision in step 218 is positive, the process then returns to step 128 in the main routine of FIG. 7.

Incidentally, data on positional deviations (Δξ, Δη) in the areas $S_{i,j}$ can be input online from the external overlay measuring. And, also in this case, the process returns to step 128 in the main routine responding to the input.

In step 128 in the main routine, the first program is loaded into the main memory, and then the process goes to step 130, where wavefronts (wavefront aberrations) corresponding to each of the areas $S_{i,j}$, or in other words, the first measurement point through the $n^{th}$ measurement point within the field of projection optical system PL, which in this case are the coefficients of each of the terms in the Zernike polynomial such as the coefficient $Z_2$ of the second term through the coefficient $Z_{37}$ of the $37^{th}$ term, are calculated according to the first program, based on the principle described below. When the main memory has enough empty area, the third program, which is loaded in advance, can be stored in the main memory, however, in this case the main memory does not have enough empty area, therefore, the third program is temporarily unloaded from the main memory to its original area in storage unit 42, and then the first program is loaded in the main memory.

In the embodiment, the wavefront of projection optical system PL is obtained by calculation according to the first program, based on the above positional deviations ($\Delta\xi$, $\Delta\eta$). Before describing this process, as a premise, the physical relation between the positional deviations ($\Delta\xi$, $\Delta\eta$) and the wavefront will be briefly described, referring to FIGS. 4 and 5.

As is representatively shown by a measurement pattern $67_{k,l}$ in FIG. 4, of the diffraction light generated from measurement pattern $67_{i,j}$, the light having passed through pinhole-shaped opening $70_{i,j}$ passes through the pupil plane of projection optical system PL at different positions, depending on where in measurement pattern $67_{k,l}$ the light comes from. That is, the wavefront at each position on the pupil plane corresponds to the optical wavefront via position, in the corresponding positions in measurement pattern $67_{k,l}$. And, when there is no aberration at all in projection optical system PL, such wavefront on the pupil plane of projection optical system PL is supposed to be an ideal wavefront (in this case, a flat plane) as in shown by a reference $F_1$. However, because there are no such projection optical systems that are free of aberration, the wavefront on the pupil plane becomes a curved surface such as wavefront $F_2$, which is indicated by a dotted curve. Therefore, the image of measurement pattern $67_{i,j}$ is formed at a deviated position on wafer W, according to the angle that the curved surface $F_2$ makes with respect to the ideal wavefront.

Meanwhile, as shown in FIG. 5, light diffracted by the reference pattern $74_1$ (or $74_2$) enters projection optical system PL directly, without being restricted by the pinhole-shaped aperture and is imaged on wafer W via projection optical system PL. Moreover, because exposure of the reference pattern $74_1$ is performed in a state where the center of reference pattern $74_1$ is positioned on the optical axis of projection optical system PL, the imaging beam generated from reference pattern $74_1$ is substantially free from aberration caused by projection optical system PL, so that the image is formed without positional deviation in an extremely small area that includes the optical axis.

Therefore, the positional deviations ($\Delta\xi$, $\Delta\eta$) directly reflect the gradients of the wavefront to an ideal wavefront, and based on such positional deviations ($\Delta\xi$, $\Delta\eta$) the wavefront can be reproduced. As is obvious from the above physical relation between the positional deviations ($\Delta\xi$, $\Delta\eta$) and the wavefront, the principle of this embodiment for calculating the wavefront is the known Shack-Hartmann wavefront calculation principle.

Next, the method of calculating the wavefront based on the above positional deviations will be described briefly.

As is described above, positional deviations ($\Delta\xi$, $\Delta\eta$) correspond to values of the gradient of the wavefront, and by integrating the positional deviations the shape of the wavefront (or to be more precise, deviations from the reference plane (the ideal plane)) is obtained. When the wavefront (deviations from the reference plane) is expressed as W(XY)

and the proportional coefficient is expressed as k, then the relation in the following equations (2) and (3) exist.

$$\Delta\xi = k\frac{\partial W}{\partial x} \quad (2)$$

$$\Delta\eta = k\frac{\partial W}{\partial y} \quad (3)$$

Because it is not easy to integrate the gradient of the wavefront given only as positional deviations, the surface shape is expanded in series so that it fits the wavefront. In this case, an orthogonal system is chosen for the series. The Zernike polynomial is a series suitable to expand a surface symmetrical with respect to an axis in, whose component in the circumferential direction is a trigonometric series. That is, when wavefront W is expressed using a polar coordinate system ($\rho$, $\theta$), the Zernike polynomial is expressed as $R_n^m(\rho)$ and is expanded as the equation (4):

$$W(\rho, \theta) = \sum_n A_n^0 R_n^0(\rho) + \sum_n \sum_m (A_n^m \cos m\theta + B_n^m \sin m\theta) R_n^m(\rho) \quad (4)$$

Because the Zernike radial polynomials $R_n^m(\rho)$ are known, the description thereof is omitted. Because the terms are orthogonal, coefficients $A_n^m$, $B_n^m$ of the terms can be determined independently. Using only finite terms provides a sort of filtering.

Because the differentials are detected as the above positional deviations in actual, the fitting needs to be performed on the differential coefficients. In the polar coordinate system ($x=\rho \cos \theta$, $y=\rho \sin \theta$), the partial differentials are represented by the equations (5), (6):

$$\frac{\partial W}{\partial x} = \frac{\partial W}{\partial \rho}\cos\theta - \frac{1}{\rho}\frac{\partial W}{\partial \theta}\sin\theta \quad (5)$$

$$\frac{\partial W}{\partial y} = \frac{\partial W}{\partial \rho}\sin\theta + \frac{1}{\rho}\frac{\partial W}{\partial \theta}\cos\theta \quad (6)$$

Because the differentials of Zernike polynomials are not orthogonal, the fitting needs to be performed in the least-squares method. Because the information (amount of positional deviation) is given in the X and Y directions for each measurement pattern, when the number of measurement patterns (for example, n=around 81 to 400) is expressed as n, then the number of observation equations derived from the above equations (2) through (6) is 2n (=around 162 to 800).

Each term of the Zernike polynomial corresponds to an optical aberration. Furthermore, lower-order terms substantially correspond to Seidel's aberrations. Therefore, by using the Zernike polynomial, the wavefront aberration of projection optical system PL can be obtained.

Incidentally, an invention related to a technology in calculating wavefront aberration is disclosed in the U.S. Pat. No. 5,978,085. In this disclosure, a mask that has the same structure as the measurement reticle $R_T$ is used, and a plurality of measurement patterns formed on the mask are sequentially exposed on a substrate via separately provided pinholes and a projection optical system, while a reference pattern on the mask is exposed on the substrate via the projection optical system without passing through condenser lens and pinholes. Then, positional deviations of the resist images of the plurality of measurement patterns from the respective resist images of the reference pattern are measured, and by predetermined computation, the wavefront aberration is calculated.

The computation procedure of the first program is determined according to the above principle, and by executing the first program the wavefront (wave-front aberration) for the first up to the $n^{th}$ measurement point within the field of projection optical system PL, or in this case, the coefficients of terms of the Zernike polynomial, such as the coefficient $Z_2$ of the second term up to the coefficient $Z_{37}$ of the $37^{th}$ term, can be obtained.

After the data of the wavefront (the coefficients of terms of the Zernike polynomial, such as the coefficient $Z_2$ of the second term through the coefficient $Z_{37}$ of the $37^{th}$ term) is obtained, the process proceeds to step 132, which sets the flag F to one and stores the data of the wavefront in a temporary storage area in the RAM.

In step 134, the third program is reloaded into the main memory. In this case, as a matter of course, the third program is loaded after the first program is unloaded into the original area in storage unit 42.

In the next step, step 136, according to the third program, one of the targeted aberrations input in step 104 is calculated for each measurement point by the following equation (7), using the Zernike sensitivity table created earlier.

$$A = K \times \{Z_2 \times \text{(the table's value)} + Z_3 \times \text{(the table's value)} + \ldots + Z_{37} \times \text{(the table's value)}\}. \quad (7)$$

A, in this case, is a targeted aberration in the projection optical system PL such as astigmatism or field curvature, or an index value of the targeted aberration such as a line-width abnormal value, which is an index value of coma.

K is a proportional constant which is set according to the sensitivity of the resist and so forth.

In the next step 138, the targeted aberration or its index value calculated for each measurement point in the manner above is shown on display unit 44. And, by this display, the operator can easily recognize the aberration of the projection optical system PL in question.

In the next step, step 140, the decision is made whether or not all the targeted aberrations (aberrations (image forming characteristics) for which conditions have been set) have been calculated. If the decision is negative, the process returns to step 136, and the next targeted aberration is calculated and displayed.

When all the targeted aberrations have been calculated in the manner above, the process proceeds to step 142 where a screen for verifying whether the simulation is to continue is displayed on display unit 44, and then the process proceeds to step 144 and stays there until a predetermined time has passed.

When the predetermined time has passed, the step moves onto step 146, where decision is made on whether or not instructions to continue the simulation has been input. When the simulation is to be continued, instructions for continuance should be given during the predetermined time, therefore, if the answer in step 146 is negative, the process of this routine ends based on the decision that the simulation does not have to continue.

Meanwhile, when instructions to continue the simulation have been input during the predetermined time, the process returns to step 102, and hereinafter repeatedly performs the process and decision-making, according to the next conditions specified in the simulation. However, in this case, because the flag F is set, the decision in step 124 is positive so the process goes from step 124 to step 136.

That is, when the wavefront aberration of projection optical system PL is measured, the simulation is continued without re-measuring the wave-front aberration.

As is described above, in the embodiment, the operator only has to sequentially input necessary items via input unit 45 according to the screen, as well as input instructions to measure the wavefront aberration, or in addition, also input data of the positional deviations ($\Delta\xi$, $\Delta\eta$) in the each of the areas $S_{i,j}$ measured by the overlay measuring unit. And, with this operation, because the targeted aberration specific to the measurement pattern of projection optical system PL (including lower-order and higher-order components of coma, astigmatism, and spherical aberration) is automatically and accurately calculated and displayed on display unit 44, the aberration can be easily and accurately recognized. Furthermore, even when the targeted aberration are in plurals, the aberration can be accurately recognized, by measuring the wavefront aberration of projection optical system PL only once. In this case, while there are various forms for displaying the targeted aberration, the form is preferred where the results are expressed numerically in a way that is easy for anyone to understand. In such a case, analysis of the coefficients of terms of the Zernike polynomial is not required.

Moreover, as is obvious from the flow chart in FIG. 7, the exposure apparatus in the embodiment can easily set the optimum exposure condition corresponding to the subject patterns. That is, the optimum exposure condition can be easily set when repeating the steps 102 and onward, by inputting the same subject pattern and the same targeted aberration (which may be a plurality of types) to the condition setting screen in step 102, and by sequentially inputting different illumination conditions, numerical apertures, wavelengths, and the like to the input screen in step 108 where information related to projection optical system PL is input. As a consequence, in step 138, the condition is defined in which the target aberration value shown in step 138 is minimal. Needless to say, the software can be modified so that main controller 50 automatically defines and sets the optimum exposure condition based on the definition. This is because, for example, the illumination condition can be changed respectively by selecting a different aperture stop of the illumination system aperture stop plate 24, the numerical aperture of the projection optical system PL can be set freely within a certain range by adjusting aperture stop 15 in FIG. 1 of projection optical system PL, and the wavelength of the illumination light EL can be changed by giving such control information TS to light source 16.

Needless to say, information on the defined exposure condition may be used when the operator creates a process program file (data file for setting exposure conditions).

Next, the method of adjusting the image forming characteristic of projection optical system PL will be described which is performed by a service technician of the exposure apparatus maker or the like, in a semiconductor manufacturing factory.

As a premise, the CD-ROM containing the first through third programs and the database created in the manner above is set in drive unit 46, and the first through third programs are installed in storage unit 42, along with the database associated with the second program.

When instructions for measuring the wavefront aberration is input by the service technician or the like, main controller 50 (CPU) transfers the pattern of measurement reticle $R_T$ onto wafer W for measuring the wavefront aberration at a plurality of (in this case, n) measurement points in the field of projection optical system PL in the same procedure as is previously described (refer to FIG. 8). Wafer W is then developed in the C/D, and when wafer W has been developed, the resist images of the measurement pattern and the reference pattern are formed in each of the areas $S_{i,j}$ arranged in a matrix on wafer W, in the same arrangement as is shown in FIG. 9B.

After that, wafer W that has been developed is removed from the C/D, and overlay errors are measured with an external overlay measuring unit (registration measuring unit) in the areas $S_{i,j}$. And, based on the results, position errors (positional deviations) of the resist images of measurement patterns $67_{i,j}$ from the corresponding images of the reference pattern $74_1$ are calculated.

Then, the data on the positional deviations $(\Delta\xi, \Delta\eta)$ in the areas $S_{i,j}$ is input into main controller 50 by the service technician or the like via input unit 45. Incidentally, the data on the positional deviations $(\Delta\epsilon, \Delta\eta)$ in the areas $S_{i,j}$ may be input into main controller 50 online from the external overlay measuring unit.

In any case, responding to the above input, the CPU of main controller 50 loads the first program in the main memory, and based on the positional deviations $(\Delta\xi, \Delta\eta)$, the wavefront (wavefront aberration) for the areas $S_{i,j}$ corresponding to the first through $n^{th}$ measurement point within the field of projection optical system PL, in this case, the coefficients for each of the terms in the Zernike polynomial, such as the coefficient $Z_2$ of the second term up to the coefficient $Z_{37}$ of the $37^{th}$ term of the Zernike polynomial, are computed according to the first program.

In the description below, data of the wavefront (wavefront aberration) for the first to the $n^{th}$ measurement point within the field of projection optical system PL is expressed by a column matrix Q, as in equation (8):

$$Q = \begin{bmatrix} P_1 \\ P_2 \\ M \\ M \\ P_n \end{bmatrix} \Lambda \tag{8}$$

In equation (8), the elements $P_1$ to $P_n$ of matrix Q are each a column matrix (vector) made up of the coefficients of the second to the $37^{th}$ terms ($Z_2$ to $Z_{37}$) of the Zernike polynomial.

When matrix Q is calculated in the manner above, main controller 50 then stores the values in the temporary storing area in the RAM.

Next, the CPU in main controller 50 loads the second program into the main memory from storage unit 42, and computes the adjustment amount of the movable lenses $13_1$ through $13_4$ previously described in directions of each degree of freedom, according to the second program.

Between data Q of the wavefront (wavefront aberration) for the first to $n^{th}$ measurement points, the matrix O stored in the CD-ROM as the database, and an adjustment amounts vector P of the movable lenses $13_1$ through $13_4$ in directions of each degree of freedom, a relation as in the following equation (9) exists:

$$Q = O \times P \tag{9}$$

In equation (9), P is a column matrix (vector) having m elements as in equation (10):

$$P = \begin{bmatrix} ADJ1 \\ ADJ2 \\ M \\ M \\ ADJm \end{bmatrix} \Lambda \tag{10}$$

Therefore, from the above equation (9), by computing the following equation (11) using the least-squares method, each of the elements ADJ1 to ADJm of P, or in other words, adjustment amount (target adjustment amount) of movable lenses $13_1$ through $13_4$ in directions of each degree of freedom can be obtained.

$$P = (O^T \times O)^{-1} \times O^T \times Q. \tag{11}$$

In equation (11), $O^T$ is the transposed matrix of matrix O and $(O^T \times O)^{-1}$ is the inverse matrix of $(O^T \times O)$.

That is, the second program is a program for performing a least-squares method computation by the above equation (11) using the database. Therefore, the CPU calculates the adjustment amount ADJ1 to ADJm according to the second program while sequentially reading the database from the CD-ROM into the RAM, and then shows the adjustment amounts on the screen of display unit 44 as well as stores the values in storage unit 42.

Next, main controller 50 gives instruction values to image forming characteristics correction controller 48 according to the adjustment amounts ADJ1 through ADJm stored in storage unit 42 on the drive amounts of the movable lenses $13_1$ through $13_4$ in directions of each degree of freedom. With this operation, image forming characteristics correction controller 48 controls the applied voltage to each of the driving devices that drives movable lenses $13_1$ through $13_4$ in directions of each degree of freedom, and at least one of a position and posture of movable lenses $13_1$ through $13_4$ is adjusted substantially at the same time, correcting the image forming characteristic of projection optical system PL such as distortion, field curvature, coma, spherical aberration, and astigmatism. As for coma, spherical aberration and astigmatism, not only the lower orders but also the higher orders of the aberration can be corrected.

As is described above, in the embodiment, when adjusting the image forming characteristic of projection optical system PL, the service technician or the like only has to input measurement instructions of the wavefront aberration via input unit 45, or in addition, input the positional deviations $(\Delta\xi, \Delta\eta)$ for the areas $S_{i,j}$ measured by the overlay measuring unit. With this operation, the image forming characteristic of projection optical system PL is adjusted almost automatically, with high accuracy.

Instead of the above equation (11), the following equation, equation (12), which is a computation program for performing a least-squares computation, may be used as the second program.

$$P = (O^T \times G \times O)^{-1} \times O^T \times G \times Q. \tag{12}$$

In equation (12), G is a diagonal matrix with n rows and n columns as in the following equation, equation (13):

$$G = \begin{bmatrix} A_{1,1} & & & \\ & A_{2,2} & & 0 \\ & & \ddots & \\ & 0 & & \\ & & & A_{n,n} \end{bmatrix} \Lambda \quad (13)$$

In addition, elements $A_{i,i}$ (i=1 through n) of matrix G each are a diagonal matrix with weight parameters δ as the elements. In this case, $A_{i,i}$ is a diagonal matrix with 36 rows and 36 columns expressed as in equation (14):

$$A_{i,i} = \begin{bmatrix} \delta_{1,1} & & & \\ & \delta_{2,2} & & 0 \\ & & \ddots & \\ & 0 & & \\ & & & \delta_{36,36} \end{bmatrix} \Lambda \quad (14)$$

Therefore, each of elements $\delta_{j,j}$ (j=1 through 36) of diagonal matrix $A_{i,i}$ represents the weight parameter corresponding to the coefficients $Z_2$ through $Z_{37}$ of the second term to the $37^{th}$ term of the Zernike polynomial measured at each measurement point. So, for example, when low order distortion obtained from the measurement results of one or a plurality of measurement points is to be corrected in particular, the values of the weight parameters such as $\delta_{1,1}$ and $\delta_{2,2}$ at the corresponding measurement points only have to be made heavier than the rest of the weight parameters. In addition, for example, when spherical aberration (0θ component) obtained from the measurement results of one or a plurality of measurement points is to be corrected in particular including the high order component, the mean of weight parameters $\delta_{8,8}$, $\delta_{15,15}$, $\delta_{24,24}$, $\delta_{35,35}$, $\delta_{36,36}$ at the corresponding measurement points only has to be made heavier than the mean of the remaining weight parameters.

In this case, another program that works with the second program is preferably provided, and the screens for specifying a measurement point and inputting the weight for each of the terms of the Zernike polynomial are to be sequentially displayed by the program. With such an arrangement, the service technician can easily set the weight parameters described above using input unit 45, by inputting the measurement point when the screen for specifying the measurement point is displayed and by inputting the weight of the term of the Zernike polynomial corresponding to the aberration to be corrected in particular heavier than the other terms when the screen for inputting the weight is displayed. Especially, on the input screen for inputting the weight, a plurality of types of input referred to above is preferred, more specifically, other than being able to input the weight of each term, input of the weight divided into four groups such as 0θ, 1θ, 3θ, and 4θ is preferred. In the latter case, a desired set value can be input by each θ group. 0θ generically refers to coefficients of the terms of the Zernike polynomial (in this case, the first and fourth terms are excluded) that do not include sin or cos ($Z_9$, $Z_{16}$, $Z_{25}$, $Z_{36}$, and $Z_{37}$); 1θ generically refers to coefficients of terms (in this case, the second and third terms are excluded) with sin θ or cos θ ($Z_7$, $Z_8$, $Z_{14}$, $Z_{15}$, $Z_{23}$, $Z_{24}$, $Z_{34}$, and $Z_{35}$); 2θ generically refers to coefficients of terms with sin 2θ or cos 2θ ($Z_5$, $Z_6$, $Z_{12}$, $Z_{13}$, $Z_{21}$, $Z_{22}$, $Z_{32}$, and $Z_{33}$); 3θ generically refers to coefficients of terms with sin 3θ or cos 3θ ($Z_{19}$, $Z_{20}$, $Z_{30}$, and $Z_{31}$), and 4θ generically refers to coefficients of terms with sin 4θ or cos 4θ ($Z_{28}$ and $Z_{29}$).

In the embodiment, as is previously described, main controller 50 executes the third program and the first program so that the image forming characteristic (aberration) of projection optical system PL to be known can be recognized almost automatically, when the operator or the like sequentially inputs necessary issues via input unit 45 according to the display on the screen and inputs instructions to measure the wavefront aberration, or in addition, inputs the data on positional deviations ($\Delta\xi$, $\Delta\eta$) for the areas $S_{i,j}$ measured by the overlay measuring unit. Therefore, after the image forming characteristic of projection optical system PL is adjusted in the manner previously described by making use of such arrangement, the service technician or the like performs the simulation previously described so that the state of whether the image forming characteristic is adjusted as planned can be confirmed on the display screen. When the adjustment is not proceeding as planned, by inputting a plurality of image forming characteristics as information related to the targeted image forming characteristic, the image forming characteristic that is not adjusted as planned can be recognized, therefore, necessary countermeasures can be taken without further delay.

In this embodiment, other than the maintenance operation, the operator or the like may also give instructions to adjust the image forming characteristic of projection optical system PL even during normal operation. After the operator or the like gives the predetermined instructions described earlier (including input of condition setting and input of information related to the projection optical system), a process similar to the above simulation is performed in the same manner by the CPU of main controller 50 to create a similar Zernike variation chart. Then, when the wavefront aberration is measured and the positional deviation data input, the CPU of main controller 50 sequentially calculates the targeted image forming characteristic in the manner described above. In this case, instead of displaying information related to the targeted image forming characteristic on display unit 44, or with the display, the CPU may calculate the drive amount of the movable lenses $13_1$ to $13_4$ in directions of each degree of freedom so that the targeted aberration is optimal (such as zero or minimal) according to, for example, the second program by the least squares method in the same manner as before. This can be achieved by a simple modification of the software.

Then, the CPU in main controller 50 provides the instruction values of the calculated drive amount to image forming characteristics correction controller 48. With this operation, image forming characteristics correction controller 48 controls the applied pressure to each of the driving devices that drives movable lenses $13_1$ through $13_4$ in directions of each degree of freedom, and at least one of a position and posture of movable lenses $13_1$ through $13_4$ is adjusted, correcting the image forming characteristic of projection optical system PL such as distortion, field curvature, coma, spherical aberration, and astigmatism. As for coma, spherical aberration and astigmatism, not only the lower orders but also the higher orders of the aberration can be corrected.

With exposure apparatus 10 in the embodiment, when semiconductor devices are manufactured, reticle R for manufacturing the devices is loaded onto reticle stage RST as the reticle, and then preparatory operations such as the reticle alignment, the so-called baseline measurement, and the wafer alignment such as the EGA (Enhanced Global Alignment) are performed.

Details on the above preparatory operations such as the reticle alignment and the baseline measurement are disclosed in, for example, Japanese Patent Application Laid-open Application No. 04-324923 and the corresponding U.S. Pat. No. 5,243,195. Furthermore, details on EGA that follows are disclosed in, for example, Japanese Patent Application Laid-open No. 61-44429 and the corresponding U.S. Pat. No. 4,780,617. As long as the national laws in designated states or elected states, to which this international application is applied, permit, the above disclosures are incorporated herein by reference.

When the preparatory operations are completed, exposure based on the step-and-repeat method is performed, similar to the measurement of the wavefront aberration. However, in this case, the stepping operation is performed based on the results of wafer alignment with the stepping in between shots serving as a unit. Incidentally, because the operation during exposure is not any different from an ordinary stepper, a detailed description is omitted.

Next, the method of making exposure apparatus 10 will be described.

When making exposure apparatus 10, first of all, illumination optical system 12 comprising optical elements such as a plurality of lenses and mirrors, projection optical system PL, and the reticle stage system and the wafer stage system made up of many mechanical components, are each assembled as units, while adjustment such as optical adjustment, mechanical adjustment, and electric adjustment are performed on each of the units so that a desirable performance can be secured in each unit.

Next, illumination optical system 12 and projection optical system PL are incorporated into the exposure apparatus main body, as well as the reticle stage system and the wafer stage system, and then the wiring and piping are connected.

Then, optical adjustment is performed on illumination optical system 12 and projection optical system PL. This is because such optical systems, especially the image forming characteristic of projection optical system PL, slightly change after being incorporated into the exposure apparatus main body. In the embodiment, the first, second, and third programs and the database previously described can also be used in the optical adjustment of projection optical system PL which is performed after projection optical system PL is installed in the exposure apparatus main body.

As a first method of optically adjusting projection optical system PL, a worker performing the adjustment operation measures the wavefront aberration of projection optical system PL using measurement reticle $R_T$ described earlier in the manner already described. Then, by inputting the measurement results to main controller 50, main controller 50 then performs the processes according to the first and second program, so that the image forming characteristic of projection optical system PL is adjusted as accurately as possible.

Then, for the purpose of confirming the adjustment results, the wavefront aberration of projection optical system PL is re-measured using measurement reticle $R_T$ described earlier in the manner and procedure previously described. Then, by inputting the measurement results of the wavefront aberration to main controller 50, main controller 50 then performs the processes according to the first and third program, and shows the astigmatism, field curvature, and/or a line-width abnormal value corresponding to coma of projection optical system PL after the adjustment on the screen. Aberrations that have not been corrected at this stage, mainly the high order aberrations, can be determined as aberrations that are difficult to adjust automatically, therefore, attachment of lenses or the like may be re-adjusted, if necessary.

As a second method of optically adjusting projection optical system PL, when a worker who performs adjustment in the manufacturing stage inputs instructions (including input of condition setting and input of information related to the projection optical system) like the adjustment described earlier, the CPU in main controller 50 performs processes according to the third program and a similar Zernike variation chart is created. Then, the wavefront aberration of projection optical system PL is measured in the procedure previously described using measurement reticle $R_T$ also described earlier. And, by inputting the measurement results of wavefront aberration to main controller 50, the CPU in main controller 50 performs processing according to the first and third programs previously described, and the targeted aberration is sequentially calculated. Then, instruction values on drive amount of movable lenses $13_1$ to $13_4$ in directions of each degree of freedom are given to image forming characteristics correction controller 48 that optimizes (zero or minimal) such targeted aberration. With this operation, image forming characteristics correction controller 48 adjusts the targeted image forming characteristic of projection optical system PL such as distortion, field curvature, coma, spherical aberration, and astigmatism, with as much precision as possible.

Then, for the purpose of confirming the adjustment results, the simulation referred to earlier is performed again and astigmatism, field curvature, a line-width abnormal value corresponding to coma, and the like of projection optical system PL that has been adjusted is displayed on screen. The aberrations that are not corrected at this point, mainly high order aberration., can be judged as aberration difficult to adjust automatically, therefore, the lens assembly can be re-adjusted if necessary.

When a desired performance cannot be obtained even when the above re-adjustment has been performed, the lenses may have to be reprocessed or replaced. In order to simplify the reprocessing of the optical elements of projection optical system PL, the wavefront aberration referred to earlier may be measured using a wavefront measurement unit or the like specified for wavefront measurement before incorporating projection optical system PL into the exposure apparatus main body, and based on the measurement results, whether or not there are optical elements that require reprocessing and its position can be identified. Then, the reprocessing of the identified optical element and the readjustment of the other optical elements may be performed in parallel.

In addition, the optical elements of projection optical system PL may be replaced per unit, or when the projection optical system has a plurality of lens barrels, they may be replaced per barrel. Furthermore, when reprocessing the optical device, its surface may be processed non-spherically, if necessary. In addition, when adjusting projection optical system PL the position (including the spacing between other optical elements) or inclination may simply be changed, or especially when the optical element is a lens element, its eccentricity may be changed or it may be rotated around optical axis AX.

Then, overall adjustment (such as electrical adjustment and operation verification) is further performed. By such operations, exposure apparatus 10 in the embodiment that can transfer a pattern of reticle R on wafer W with good precision using projection optical system PL whose optical properties have been adjusted with high precision can be made. The exposure apparatus is preferably built in a clean room where the temperature and the degree of cleanliness are controlled.

As is obvious from the description so far, in the embodiment, main controller 50 constitutes a computing unit; the first computing unit and the second computing unit, and main controller 50 and image forming characteristics correction controller 48 constitutes an image forming characteristics adjusting unit. Furthermore, the measurement reticle $R_T$, the external overlay measuring unit, and main controller 50 make up a measuring unit for measuring the wavefront aberration of projection optical system PL.

As has been described in detail, according to the exposure apparatus in the embodiment, when the measuring unit (such as $R_T$ and 50) measures the wavefront aberration of projection optical system PL according to instructions from the operator, and main controller 50 calculates the targeted image forming characteristic of projection optical system PL, based on the wavefront aberration of projection optical system PL which has been measured and the Zernike sensitivity table of the targeted image forming characteristic corresponding to the aberration information given when the subject pattern was exposed. By using the Zernike sensitivity table in the manner described above, the targeted image forming characteristic can be calculated with only one measuring of the wavefront aberration. In this case, in the measuring, as for spherical aberration, astigmatism, and coma, not only the low order aberration, but also a total aberration including the high order aberration can be calculated.

In addition, since the targeted image forming characteristic is corrected as much as possible by image forming characteristics adjusting unit (48 and 50) based on the calculation results of the targeted aberration (image forming characteristic), the image forming characteristic of projection optical system PL is consequently adjusted according to the subject pattern.

In addition, according to exposure apparatus 10 in the embodiment, parameters that denote a relationship between the adjustment of specific optical elements for adjustment (movable lenses $13_1$ through $13_4$) and the variation of the image forming characteristic of projection optical system PL are obtained in advance, and the parameters are stored as a database in storage unit 42. And, based on instructions from the service technician or the like on adjustment, the wavefront aberration of projection optical system PL is actually measured, and then when the measurement data (actual measurement data) is input via input unit 45, main computer 50 calculates the target adjustment amount of movable lenses $13_1$ through $13_4$, using the actual measurement data of the wavefront aberration input via input unit 45 and a relation expression between the parameters and the movable lenses $13_1$ through $13_4$ (equation (11) or equation (12)). Because the above parameters are obtained in advance and stored in storage unit 42, when the wavefront aberration is actually measured, the target adjustment amount of the movable lenses $13_1$ through $13_4$ for correcting the wavefront aberration can be easily calculated by simply inputting the actual measurement values of the wavefront aberration via input unit 45. In this case, data that are difficult to obtain, such as the design data of the lenses are not necessary, as well as a difficult ray-tracing calculation.

Then, the target adjustment amount is given as instruction values to image forming characteristics correction controller 48 from main controller 50, and image forming characteristics correction controller 48 adjusts movable lenses $13_1$ through $13_4$ according to the target adjustment amount, performing a simple but highly precise adjustment on the image forming characteristic of projection optical system PL.

In addition, according to exposure apparatus 10 in the embodiment, when exposure is preformed, because the pattern of reticle R is transferred onto wafer W via projection optical system PL whose image forming characteristic is adjusted in the manner described above according to the subject pattern or whose image forming characteristic is adjusted with high precision based on the measurement results of wavefront aberration, fine patterns can transferred onto wafer W with good overlay accuracy.

In the above embodiment, the case has been described where on simulation, various types of information including information on the subject pattern, information on the targeted image forming characteristic, information on the projection optical system, and information on the aberration that is to be given is input to main controller 50 via input unit 45 such as a keyboard, and based on such information, main controller 50 makes a Zernike sensitivity table of the targeted image forming characteristic that corresponds to the aberration information given when main controller 50 exposed the subject pattern. However, the present invention is not limited to this. That is, the third program may be installed into a different computer for simulation other than main controller 50, and various assumptions may be made on information such as the object pattern and information on the projection optical system. And based on each assumption, input operation may be repeatedly performed to make the Zernike sensitivity table of various types corresponding to the input information in advance, while sequentially changing the condition setting, as well as the information on the targeted aberration, the information on the projection optical system, and the information on the aberration that is to be given, and from these variation tables a database may be made, which may be stored in the CD-ROM along with the first and second programs.

When the database made up of the Zernike sensitivity table of various types described above is made in advance, a program (hereinafter called "the fourth program" for the sake of convenience) is to be prepared, which is a simplified program of the third program to make the CPU in main controller 50 perform the computation previously described using a corresponding Zernike sensitivity table in response to the input of the measurement results of the wavefront aberration and setting conditions and to make the CPU immediately calculate and display the targeted aberration. The fourth program is to be stored in the above CD-ROM.

Then, on simulation, the first and fourth programs in the CD-ROM are installed on the storage unit 42, and at the same time the database consisting of the Zernike sensitivity table is copied to the storage unit 42. Or, only the first and fourth programs in the CD-ROM may be installed on the storage unit 42 and the CD-ROM may be left in drive unit 46. In the latter case, on simulation, main controller 50 is to read the database of the Zernike sensitivity table from the CD-ROM when necessary. In this case, the CD-ROM set inside drive unit 46 makes up the storage unit. This can be accomplished, by modifying the software.

In the above embodiment, the case has been described where a wavefront aberration, which is an overall aberration, is measured as the image forming characteristics of the projection optical system, and the target adjustment amount of the movable lenses (specific optical elements for adjustment) for correcting the wavefront aberration is calculated, according to the measurement results. However, the present invention is not limited to this. For example, the image forming characteristics of the projection optical system subject to adjustment may be individual image forming characteristics, such as coma or distortion. In this case, for example, a relationship between the unit quantity adjustment amount of the specific optical elements for adjustment in directions of each degree of freedom and the variation amount of the individual image forming characteristics such as coma or distortion is obtained by simulation, and based on the results, parameters denoting the relationship between the adjustment of the specific optical element and the change in the image forming characteristics of the projection optical system is obtained, and then a database is made by the parameters. Then, when actually adjusting the image forming characteristics of the projection optical system, by obtaining coma (or a line-width abnormal value), distortion, or the like of the projection optical system using, for example, the exposing method or aerial image measurement method, and inputting the-measurement values to the main controller, the target adjustment amount of the specific optical element can be decided by calculation likewise the above embodiment, using a relation equation between the image forming characteristics that has been obtained, the parameters, and the target adjustment amount of the specific optical element (such relation expression is to be prepared in advance).

Figure 10:
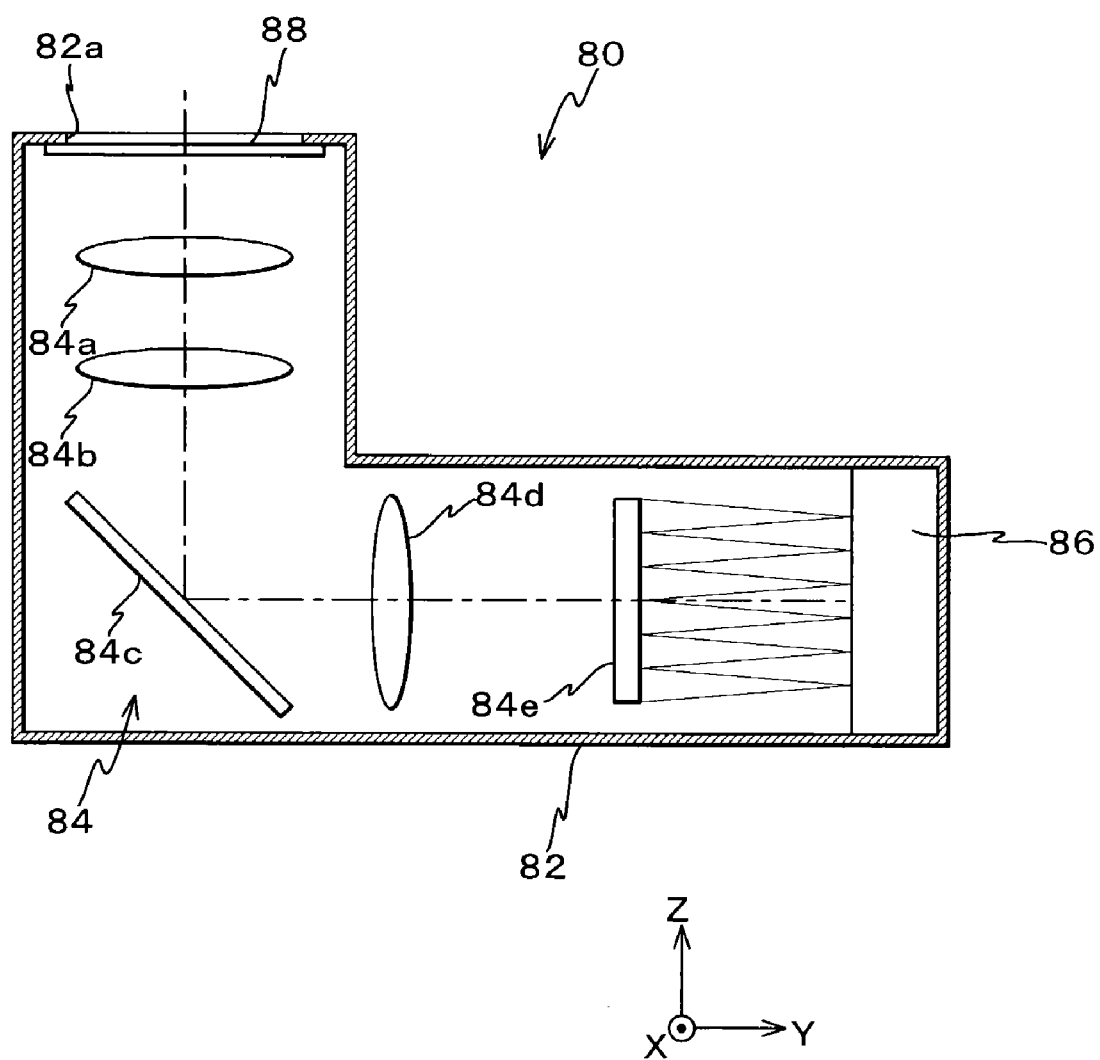
FIG. 10 is a sectional view showing an example of a portable wavefront-aberration measuring unit.

In addition, in the above embodiment, the case has been described where the wavefront aberration of projection optical system PL is measured using a measurement reticle. The present invention, however, is not limited to this, and the measurement of the wavefront aberration may be performed on body using a portable wavefront aberration measuring unit that is detachable to wafer stage WST. As such a wavefront aberration measuring unit, a wavefront aberration measuring unit 80 based on the Shack-Hartmann method that uses a microlens array in its photodetection optical system may be used, as is shown in FIG. 10.

Details such as the structure of wavefront aberration measuring unit 80 will now be briefly described. As is shown in FIG. 10, wavefront aberration measuring unit 80 comprises a housing 82 whose inner space has an L-shaped cross section in an YZ plane, a photodetection optical system 84, which is composed of a plurality of optical elements arranged in a predetermined positional relationship in housing 82, and a photodetection portion 86, which is disposed on the +Y side end within housing 82.

Housing 82 is made from a member whose cross section in the YZ plane is shaped in the letter L, having a space formed therein, and at its topmost portion (the end portion in the +Z direction), an opening 82a that has a circular shape when in a planar view is formed so that the light from above housing 82 will be guided into the inner space of housing 82. In addition, a cover glass 88 is provided so as to cover opening 82a from the inside of housing 82. On the upper surface of cover glass 88, a light shielding membrane that has a circular opening in the center is formed by vapor deposition of metal such as chrome, which shields unnecessary light from entering photodetection optical system 84 when the wavefront aberration of projection optical system PL is measured.

Photodetection optical system 84 is made up of an objective lens 84a, a relay lens 84b, and a deflecting mirror 84c, which are sequentially arranged from under cover glass 88 inside housing 82 in a downward direction, and a collimator lens 84d and a microlens array 84e, which are sequentially arranged on the +Y side of deflecting mirror 84c. Deflecting mirror 84c is provided having an inclination of 45°, and by deflecting mirror 84c, the optical path of the light entering the objective lens 84a from above in a downward vertical direction is deflected toward the collimator lens 84d. Each of the optical members that make up photodetection optical system 84 is fixed to the wall of housing 82 on the inner side, via holding members (not shown), respectively. Microlens array 84e has a plurality of small convex lenses (lens elements) that are arranged in an array shape on a plane perpendicular to the optical path.

Photodetection portion 86 is made up of parts like a photodetection element such as a two-dimensional CCD, and an electric circuit such as a charge transport controlling circuit. The photodetection element has an area large enough to receive all the beams that have entered objective lens 84a and are outgoing microlens array 84e. The measurement data of photodetection portion 86 is output to main controller 50 via a signal line (not shown).

Next, the measuring method of wavefront aberration using wavefront aberration measuring unit 80 will be described. In the following description, for the sake of simplicity, the aberration of photodetection optical system 84 in wavefront aberration measuring unit 80 is to be small enough so that it can be ignored.

First of all, on normal exposure, because wavefront aberration measuring unit 80 is detached from Z tilt stage 58, the operator performs the operation of attaching wavefront aberration measuring unit 80 to the side surface of Z tilt stage 58 when wavefront measurement is performed. On such attachment operation, wavefront aberration measuring unit 80 is fixed to a predetermined reference surface (in this case, the surface on the +Y side) via bolt or a magnet, so that wavefront aberration measuring unit 80 is within the movement strokes of wafer stage WST (Z tilt stage 58) during wavefront measurement.

After the above attachment has been completed, in response to the command input by the operator to start the measurement, main controller 50 moves wafer stage WST via wafer stage drive portion 56 so that wavefront aberration measuring unit 80 is positioned below the alignment system referred to earlier based on the off-axis method. Then, main controller 50 detects alignment marks (not shown) provided on wavefront aberration measuring unit 80 with the alignment system, and based on the detection results and the measurement values of laser interferometer 54W at that point, calculates the position coordinates of the alignment marks and obtains the accurate position of wavefront aberration measuring unit 80. Then, after the position of the wavefront aberration measuring unit 80 is measured, the wavefront aberration is measured in the following manner, with main controller 50 playing the main role.

First of all, main controller 50 loads a measurement reticle (not shown) on which pinhole patterns are formed (hereinafter referred to as a 'pinhole reticle' in order to distinguish it from measurement reticle $R_T$ previously described) with a reticle loader (not shown) on reticle stage RST. This measurement reticle has pinholes (which become ideal point light sources that generate spherical waves) formed on its pattern surface at a plurality of points in an area identical to illumination area IAR, and is used only for measurement.

In the pinhole reticle used in this case, for example, a diffusion plate is provided on its upper surface so that the wavefront of the beams passing through all the numerical apertures of projection optical system PL can be obtained, that is, the wavefront aberration covering all the numerical apertures of projection optical system PL are measured.

After the pinhole reticle is loaded, main controller 50 detects reticle alignment marks formed on the pinhole reticle using the reticle alignment microscope described earlier, and based on the detection results, aligns the pinhole reticle at a predetermined position. With this operation, the center of the pinhole reticle is substantially made to coincide with the optical axis of projection optical system PL.

Then, main controller 50 gives control information TS to light source 16 so as to make it start emitting the laser beam. With this operation, illumination light EL from illumination optical system 12 is irradiated on the pinhole reticle. Then, the beams outgoing from the plurality of pinholes on the pinhole reticle are condensed on the image plane via projection optical system PL, and the images of the pinholes are formed on the image plane.

Next, main controller 50 moves wafer stage WST via wafer stage drive portion 56 so that the substantial center of opening 82a of wavefront aberration measuring unit 80 coincides with an image forming point where an image of a pinhole on the pinhole reticle (hereinafter referred to as 'focused pinhole') is formed, while monitoring the measurement values of wafer laser interferometer 54W. On such operation, based on the detection results of the focal point position detection system previously described, main controller 50 finely moves wafer stage WST in the Z-axis direction via wafer stage drive portion 56 so that the upper surface of cover glass 88 of wavefront-aberration measuring unit 80 coincides with the image plane on which the pinhole images are formed. When wafer stage WST is being finely moved, the angle of inclination is also adjusted if necessary. In this manner, the imaging beam of the focused pinhole enters photodetection optical system 84 via the opening in the center of cover glass 88, and is photodetected by the photodetection elements making up the photodetection portion 86.

More particularly, from the focused pinhole on the pinhole reticle, a spherical wave is generated which becomes parallel beams via projection optical system PL and objective lens 84a, relay lens 84b, mirror 84c, and collimator lens 84d that make up the photodetection optical system 84 and irradiate microlens array 84e. With this operation, the pupil surface of projection optical system PL is relayed to microlens array 84e, and then divided thereby. And then, by each lens element of microlens array 84e, the respective beams are condensed on the photodetection surface of the photodetection element, and the images of the pinholes are respectively formed on the photodetection surface.

Figure 11A:
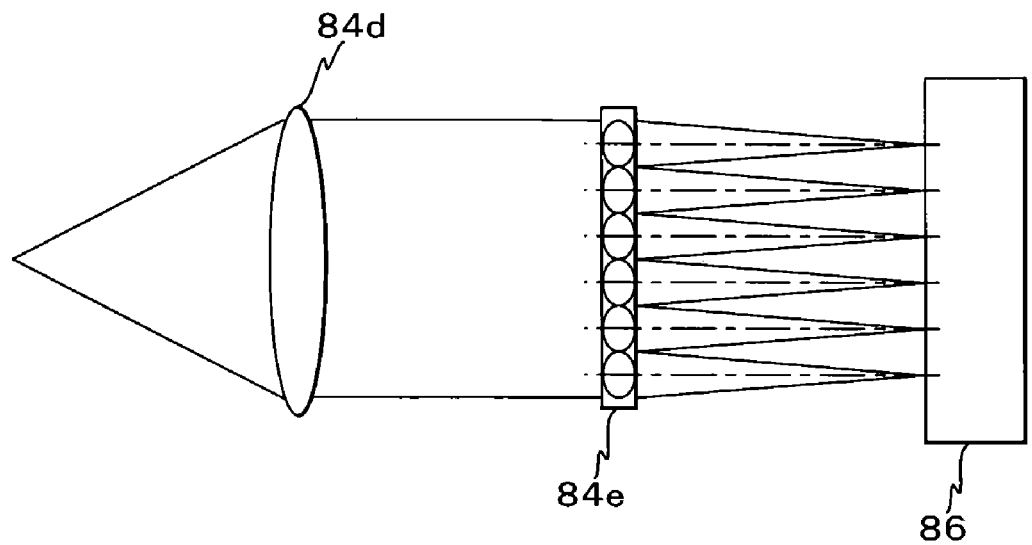
FIGS. 11A and 11B are views showing beams outgoing from a microlens array, in cases where there is no aberration in the optical system and where there is aberration in the optical system, respectively.

In this case, when projection optical system PL is an ideal optical system that does not have any wavefront aberration, the wavefront in the pupil plane of projection optical system PL becomes an ideal shape (in this case, a planar surface), and as a consequence, the parallel beams incident on microlens array 84e is supposed to be a plane wave that has an ideal wavefront. In this case, as is shown in FIG. 11A, a spot image (hereinafter also referred to as a 'spot') is formed at a position on the optical axis of each lens element that make up microlens array 84e.

Figure 11B:
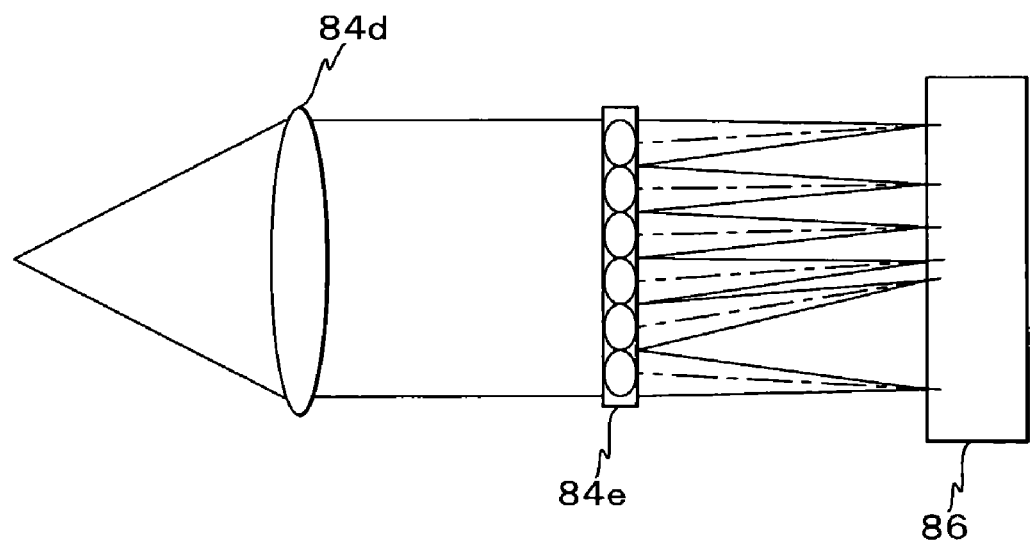

However, in projection optical system PL, because there normally is wavefront aberration, the wavefront of the parallel beams incident on microlens array 84e shifts from the ideal wavefront, and corresponding to the shift, that is, the inclination of the wavefront with respect to the ideal wavefront, the image forming position of each spot shifts from the position on the optical axis of each lens element of microlens array 84e, as is shown in FIG. 11B. In this case, the positional deviation of each spot from its reference point (the position on the optical axis of each lens element) corresponds to the inclination of the wavefront.

Then, the light incident on each condensing point on the photodetection element making up photodetection portion 86 (beams of the spot images) is photoelectrically converted at the photodetection elements, and the photoelectric conversion signals are sent to main controller 50 via the electric circuit. Based on the photodetection conversion signals, main controller 50 calculates the image forming position of each spot, and furthermore, calculates the positional deviation ($\Delta\xi$, $\Delta\eta$) using the calculation results and the positional data of the known reference points and stores it in the RAM. On such operation, the measurement values of laser interferometer 54W at that point (Xi, Yi) are being sent to main controller 50.

When measurement of positional deviation of the spot images by wavefront aberration measuring unit 80 at the image forming point of the focused pinhole image is completed, main controller 50 moves wafer stage WST so that the substantial center of opening 82a of wavefront aberration measuring unit 80 coincides with the image forming point of the next pinhole image. When this movement is completed, main controller 50 makes light source 16 generate the laser beam as is described above, and similarly calculates the image forming position of each spot. Hereinafter, a similar measurement is sequentially performed at the image forming point of other pinhole images.

When all the necessary measurement has been completed, in the RAM of main controller 50, data on the positional deviation ($\Delta\xi$, $\Delta\eta$) of each pinhole image at the image forming point previously described and the coordinate data of each image forming point (the measurement values of laser interferometer 54W (Xi, Yi) when performing measurement the image forming point of each pinhole image) are stored.

Then, main controller 50 calculates the wavefront data (the coefficients of each term of the Zernike polynomial), based on the positional deviation ($\Delta\xi$, $\Delta\eta$) of the image forming points of the pinhole images stored in the RAM that corresponds to the inclination of the wavefront on the pupil surface of projection optical system PL, using a different conversion program similar to the first program, which was previously described. The reason for stating 'similar to the first program' is because, when wavefront aberration measuring unit 80 described earlier is used, a program different from the first program is normally prepared that converts the positional deviation amount of the image forming point of the spot images that are measured into coefficients of each term of the Zernike polynomial.

As is obvious from the description so far, when the wavefront aberration is measured using wavefront aberration measuring unit 80, wafer development or the like will not be required, therefore, reduction of the measurement time can be expected. In addition, because wafer development or the like will not be required, there is also an advantage of exposure apparatus 10 being able to perform a so-called self-measurement in a state where wavefront aberration measuring unit 80 is attached to wafer stage WST. Then, by performing a process according to a procedure similar to the above embodiment, main controller 50 can calculate and display the targeted aberration (image forming characteristics), and furthermore, automatically perform adjustment of the image forming characteristic of projection optical system PL.

In the above embodiment, the case has been described where the first program, which converts the positional deviation amount measured using measurement reticle $R_T$ into coefficients of each term of the Zernike polynomial, the second program, which computes the adjustment amount of the image forming characteristics based on the coefficients of each term of the Zernike polynomial that were converted in the first program, the third program, which converts the coefficients of each term of the Zernike polynomial converted in the first program into various aberrations (including index of such aberrations), and the database that goes with the second program, are all packaged in a single CD-ROM. Such a packaging, however, is not a mandatory. That is, the first program, the second program (and its database), and the third program are programs that have different purposes, which means that they all have sufficient utility values independently.

Especially with the third program, a part of it that makes the Zernike sensitivity table (corresponding to steps 101 through 122) can be used as a single program. By inputting various types of information including information on a subject pattern, information of the targeted image forming characteristic, information on the projection optical system, and information on a given aberration from an input unit such as a keyboard into a computer that has such a program installed, the Zernike sensitivity table of the targeted image forming characteristic is made. Accordingly, the database consisting of the Zernike sensitivity table made in the manner above can be suitably used in other exposure apparatus as is previously described.

For example, when the wavefront aberration measuring unit referred to earlier is used, a program different from the first program is normally prepared that converts the positional deviation amount of the image forming point of the spot images that are measured into coefficients of each term of the Zernike polynomial, and even when the second program and its database, and the third program are combined with such a conversion program, it is obvious that the second program and its database, and the third program can sufficiently show their capability.

In addition, especially with the second program and the third program, they do not necessarily have to be combined because their purposes differ greatly. The purpose of the former is to make the operation efficient for a service technician or the like performing repair and adjustment on the exposure apparatus the image forming characteristics of the projection optical system need to be adjusted, whereas, the purpose of the latter is to perform a simulation to confirm whether the targeted image forming characteristic of the projection optical system is sufficient enough when the operator or the like of the exposure apparatus in a semiconductor manufacturing site exposes a subject pattern. When taking into consideration such differences in their purposes, in the case the second program and its database and the third program are in the same software package as in the above embodiment, for example, two types of passwords is settable. In such a case, the second and third program may be supplied as a different information storage medium such as a firmware, and only the database may be recorded in a storage medium such as the CD-ROM.

In addition, in the above embodiment, on the adjustment of the image forming characteristic of projection optical system PL, the first to third program was installed on storage unit 42 from the CD-ROM, and the database was copied to storage unit 42. The present invention, however, is not limited to this, and so long as only the first to third programs are installed on storage unit 42 from the CD-ROM, the database does not have to be copied to storage unit 42. In this case, the CD-ROM set in the drive unit structures the storage unit.

Figure 2F:
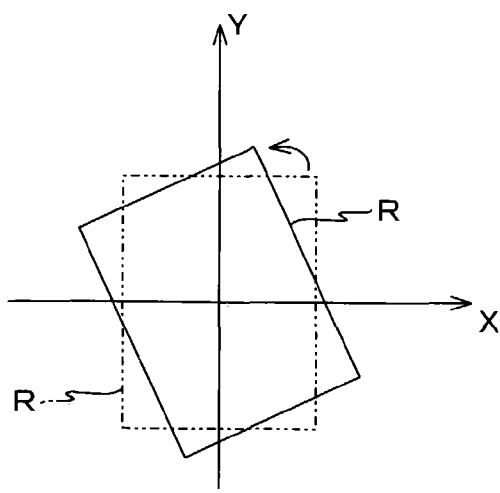

In the above embodiment, the case has been described where the database is made up of parameters corresponding to the unit drive amount of movable lenses $13_1$ to $13_4$ in directions of each degree of freedom. However, the present invention is not limited to this, and in cases such as when a part of the lens making up projection optical system PL can be easily exchanged, parameters that show the change of the image forming characteristics corresponding to the thickness of the lens may be included. In such a case, the optimal lens thickness is to be calculated as the target adjustment amount. Besides such parameters, the database may include parameters that show the change of the image forming characteristics corresponding to the reticle rotation. In this case, for example, when reticle R rotates as is shown in FIG. 2F, such rotation may be in a + (positive) direction, and the unit rotation amount may be 0.1 degrees. In this case, according to the calculated reticle rotation, for example, only at least one of reticle stage RST and wafer stage WST has to be rotated. And, other than such parameters, details whose change affects the image forming characteristics of the projection optical system and is also adjustable can also be included in the database, such as center wavelength of the illumination light, or the position of the reticle or the like in the optical axis direction.

In addition, in the above embodiment, the case has been described where main controller 50 automatically adjusts the image forming characteristics of the projection optical system PL via image forming characteristics correction controller 48, based on the target adjustment amount of the specific optical elements computed according to the second program or the targeted aberration amounts computed according to the third program. However, the present invention is not limited to this, and the image forming characteristic of projection optical system PL may be adjusted manually by an operator or via an operation. In such a case, the second program or the third program can be effectively used not only in the adjustment stage, but also in the manufacturing stage, which allows production of a projection optical system whose image forming characteristics are adjusted.

In the above embodiment, the case has been described where reference patterns are provided on measurement reticle $R_T$ along with measurement patterns, however, the reference patterns do not have to be provided on the measurement reticle masks (measurement reticle $R_T$ in the case of the above embodiment) for measuring optical properties. That is, the reference patterns may be provided on a different mask, or the reference patterns may not be provided on the mask side but be provided on the substrate (wafer) side instead. More particularly, a reference wafer on which the reference patterns are formed in advance in a size corresponding to the projection magnification can be used, and by coating a resist on the reference wafer, transferring the measurement patterns on the resist layer, and developing the patterns, and then by measuring the positional deviating between the resist image of the measurement pattern that can be obtained after development and the reference marks, substantially the same measurement as in the above embodiment can be performed.

In addition, in the above embodiment, after the measurement pattern and the reference pattern has been transferred onto wafer W, the wavefront aberration of projection optical system PL was calculated based on the measurement results of the resist image that was obtained by developing the wafer. The present invention, however, is not limited to this, and the projection image (aerial image) or the measurement pattern can be projected on the wafer and the projected image (aerial image) may be measured using an aerial image measuring unit, or the latent images of the measurement patterns and the reference patterns formed on the resist layer or images that are obtained by wafer etching may be measured. In such cases, as long as the positional deviation of the measurement patterns from the reference position (such as the designed projection position of the measurement pattern) are measured, the wavefront aberration of the projection optical system can be measured in the procedure similar to the above embodiment based on the measurement results. Also, instead of transferring the measurement pattern onto the wafer, a reference wafer on which the reference pattern is already formed may be prepared in advance, and the reference pattern may be transferred onto its resist layer and the positional deviation measured, or an aerial image measuring unit that has a plurality of apertures corresponding to the measurement patterns may be used to measure the positional deviation between the apertures and the reference pattern. Furthermore, in the above embodiment, the positional deviation previously described was measured using an overlay measuring unit, however, other units may be used, such as for example, an alignment sensor provided in the exposure apparatus.

In addition, in the above embodiment, the coefficients of the terms of the Zernike polynomial were used up to the $37^{th}$ term, however, the $38^{th}$ term and higher terms may be used, such as using the terms up to the $81^{st}$ term so that the high order component of each aberration of projection optical system PL may be calculated. That is, the number of terms or the numbers used in the Zernike polynomial may be any number. Furthermore, because the aberration of projection optical system PL may be positively generated depending on the illumination conditions or the like, in the above embodiment, the optical elements of projection optical system PL may be adjusted so that the targeted aberration becomes a predetermined value, in addition to the targeted aberration being either zero or a minimal quantity at all times.

Furthermore, in the above embodiment, a service technician performed the installation of the programs previously described. However, for example, the programs may be installed in a server connected through the Internet or the like to a host computer that totally controls manufacturing equipment such as exposure apparatus or a manufacturing line including a large number of manufacturing equipment, or the programs may be installed in the exposure apparatus. In this case, the operator may enter the pattern information, or the exposure apparatus may be made to obtain the pattern information by reading a bar code or a two dimensional code of a reticle on which the pattern to be transferred onto a wafer is formed, so that the exposure apparatus or the server can automatically perform the making of the Zernike sensitivity table described earlier, deciding the optimum exposure condition (conditions such as illumination condition and the numerical apertures of projection optical system PL), and adjusting the image forming characteristic of projection optical system PL, without any intervening by the operator or the service technician. On such automation, when, for example, the measurement reticle described earlier is used when measuring the wavefront aberration, the alignment system of the exposure apparatus may detect the positional deviation of the latent images of the measurement pattern formed on a resist layer of a wafer from the latent images of the reference pattern. In addition, in the above embodiment, the operator or the like fixed wavefront aberration measuring unit 80 to wafer stage WST, however, for example, a carriage system (such as a wafer loader) that performs wafer or wafer holder exchange may be used to automatically carry wavefront aberration measuring unit 80.

In the above embodiment, the case has been described where the present invention has been applied to a stepper, however, the present invention is not limited to this, and the present invention can also be suitably applied to a scanning type exposure apparatus like the one disclosed in, for example, U.S. Pat. No. 5,473,410 that transfers a pattern of a mask onto a substrate while synchronously moving the mask and the substrate.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing thin-film magnetic heads, micromachines, DNA chips, and the like. Furthermore, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

In addition, the light source of the exposure apparatus in the above embodiment is not limited to an ultraviolet pulse light source such as an $F_2$ laser, an ArF excimer laser, or a KrF excimer laser, and an ultra-high pressure mercury lamp emitting an emission line such as g-line (a wavelength of 436 nm) or i-line (a wavelength of 365 nm) can also be used.

In addition, a harmonic wave may be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Also, the magnification of the projection optical system is not limited to a reduction system, and an equal magnification or a magnifying system may be used. Furthermore, the projection optical system is not limited to a refraction system, and a catadioptric system that has reflection optical elements and refraction optical elements may be used as well as a reflection system that uses only reflection optical elements. When the catadioptric system or the reflection system is used as projection optical system PL, the image forming characteristics of the projection optical system are adjusted by changing the position or the like of the reflection optical elements (such as a concave mirror or a reflection mirror) that serve as the specific optical elements previously described. In addition, when the $F_2$ laser beam, the $Ar_2$ laser beam, the EUV light, or the like is used as illumination light EL, projection optical system PL can be a total reflection system that has only reflection optical elements. However, when the $Ar_2$ laser beam, the EUV light, or the like is used, reticle R also needs to be a reflective type reticle.

Incidentally, semiconductor devices are made undergoing the following steps: a device function/performance designing step, a reticle making step where a reticle is made based on the designing step, a wafer making step where a wafer is made from silicon material, a transferring step where the pattern of the reticle is transferred onto the wafer by the exposure apparatus in the embodiment, a device assembly step (including the dicing process, bonding process, and packaging process), and an inspection step. According to the device manufacturing method, because exposure is performed in a lithographic process using the exposure apparatus in the above embodiment, the pattern of reticle R is transferred onto wafer W via projection optical system PL whose image forming characteristics are adjusted according to a subject pattern, or whose image forming characteristics are adjusted with high precision based on the measurement results of the wavefront aberration, and therefore it is possible to transfer the detailed pattern onto wafer W with high overlay accuracy. Accordingly, the yield of the devices as final products is improved, which makes it possible to improve its productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A method of adjusting an image forming state of a pattern image projected onto an object via a projection optical system, said method comprising:
   measuring information related to wavefront aberration of said projection optical system at one measurement point at the least in a field of said projection optical system; and
   optimizing a weighting function to compensate an error of said pattern image, and calculating adjustment information in an adjusting unit that adjusts the image forming state of said pattern image, based on said information related to wavefront aberration and a Zernike sensitivity table corresponding to projection conditions of said pattern image.

2. The method according to claim 1 wherein in calculating said adjustment information, data related to a relation between an adjustment amount of said adjusting unit and a change in coefficients of each term in a Zernike polynomial is used.

3. The method according to claim 2 wherein in order to adjust the image forming state of said pattern image, adjustment information related to at least an optical element of said projection optical system is calculated.

4. The method according to claim 3 wherein in order to adjust the image forming state of said pattern image, adjustment information related to illumination light used for projection of said pattern image is calculated.

5. The method according to claim 3 wherein said projection conditions include at least an illumination condition of a pattern arranged on an object plane of said projection optical system.

6. The method according to claim 5 wherein when different pattern images are each projected by said projection optical system, said adjustment information is calculated using a Zernike sensitivity table for each of said pattern images.

7. The method according to claim 6 wherein said Zernike sensitivity table is a table in which a predetermined value of aberration is given to each term in a Zernike polynomial and a targeted image forming characteristic of said projection optical system is calculated for a plurality of terms in said Zernike polynomial.

8. The method according to claim 1 wherein in order to adjust the image forming state of said pattern image, adjustment information related to at least one of an optical element of said projection optical system and illumination light used for projection of said pattern image is calculated.

9. The method according to claim 8 wherein the optical element of said projection optical system is moved, based on said calculated adjustment information.

10. The method according to claim 9 wherein a characteristic of said illumination light is changed, based on said calculated adjustment information.

11. The method according to claim 10 wherein the characteristic of said illumination light includes wavelength.

12. The method according to claim 1 wherein said projection conditions include at least an illumination condition of a pattern arranged on an object plane of said projection optical system.

13. The method according to claim 12 wherein when different pattern images are each projected by said projection optical system, said adjustment information is calculated using a Zernike sensitivity table for each of said pattern images.

14. The method according to claim 1 wherein for the calculation of said adjustment information, a least-squares method is used, and
said Zernike sensitivity table is a table in which a predetermined value of aberration is given to each term in a Zernike polynomial and a targeted image forming characteristic of said projection optical system is calculated for a plurality of terms in said Zernike polynomial.

15. The method according to claim 14 wherein information related to wavefront aberration of said projection optical system is measured at each of a plurality of points within a predetermined area, in which said pattern image is projected, in a field of said projection optical system, and
for the calculation of said adjustment information, the measurement information is used.

16. An exposure method in which a pattern is transferred onto an object via a projection optical system, said method including
calculating adjustment information in an adjusting unit that adjusts an image forming state of a pattern image projected onto said object via said projection optical system, using said method according to claim 1; and
transferring said pattern onto said object by controlling said adjusting unit based on said calculated adjustment information.

17. The exposure method according to claim 16 wherein said adjustment information is calculated, based on said information related to wavefront aberration, said Zernike sensitivity table, and data related to a relation between an adjustment amount of said adjusting unit and a change in coefficients of each term in a Zernike polynomial.

18. A device manufacturing method, wherein a device pattern is transferred onto a photosensitive object using said exposure method according to claim 16.

19. The method according to claim 1 wherein in order to adjust the image forming state of said pattern image, at least one optical element of said projection optical system is moved, and
an adjustment amount of said at least one optical element is calculated as said adjustment information, based on said information related to wavefront aberration, said Zernike sensitivity table, and data related to a relation between an adjustment amount of said at least one optical element and a change in coefficients of each term in a Zernike polynomial.

20. An exposure method in which a pattern is transferred onto an object via a projection optical system, said method including
 calculating adjustment information in an adjusting unit that adjusts an image forming state of a pattern image projected onto said object via said projection optical system, using the method according to claim 19; and
 transferring said pattern onto said object by controlling said adjusting unit based on said calculated adjustment information.

21. An image forming characteristics adjusting method in which at least one image forming characteristic of a projection optical system is adjusted, said method including:
 measuring information related to wavefront aberration of said projection optical system; and
 adjusting said image forming characteristic by driving an optical element of said projection optical system, based on data of a relation between an adjustment amount of said optical element and a change in coefficients of each term in a Zernike polynomial, and said information related to wavefront aberration.

22. The image forming characteristics adjusting method according to claim 21 wherein
 said information related to wavefront aberration is expressed in a Zernike polynomial, and different weighting is performed on a plurality of terms in said Zernike polynomial to decide said adjustment amount of said optical element, in order to adjust an image forming characteristic of a plurality of types of said projection optical system.

23. An exposure method in which a pattern formed on a mask is transferred onto an object via a projection optical system, said exposure method comprising:
 adjusting at least one image forming characteristic of said projection optical system using said image forming characteristics adjusting method according to claim 21; and
 transferring said pattern onto said object using said projection optical system whose image forming characteristic is adjusted.

24. The image forming characteristics adjusting method according to claim 21 wherein
 in order to adjust said image forming characteristic, an adjustment amount of said optical element is decided using a Zernike sensitivity table of an image forming characteristic of said projection optical system that becomes an evaluation item.

25. The image forming characteristics adjusting method according to claim 24 wherein
 in order to adjust said image forming characteristic, an adjustment amount of said optical element is decided using a least-squares method.

26. The image forming characteristics adjusting method according to claim 25 wherein
 when different patterns are each projected by said projection optical system, an adjustment amount of said optical element is decided using the Zernike sensitivity table for each of said patterns.

27. The image forming characteristics adjusting method according to claim 25 wherein
 when said image forming characteristic that becomes an evaluation item includes image forming characteristics of a plurality of types, an adjustment amount of said optical element is decided using the Zernike sensitivity table for each of said image forming characteristics of a plurality of types.

28. The image forming characteristics adjusting method according to claim 25 wherein
 when a plurality of projection conditions are settable on projection of a pattern by said projection optical system, an adjustment amount of said optical element is decided using the Zernike sensitivity table for each of said projection conditions.

29. The image forming characteristics adjusting method according to claim 25 wherein
 when a plurality of illumination conditions are settable on projection of a pattern by said projection optical system, an adjustment amount of said optical element is decided using the Zernike sensitivity table for each of said illumination conditions.

30. The image forming characteristics adjusting method according to claim 21 wherein
 information related to wavefront of said projection optical system is measured at each of a plurality of points within a predetermined area, in which a pattern is projected, in a field of said projection optical system, and the measurement information is used for adjustment of said image forming characteristic.

31. The image forming characteristics adjusting method according to claim 21 wherein
 in order to adjust said image forming characteristic, an adjustment amount of said optical element is decided using a weighting function.

32. The image forming characteristics adjusting method according to claim 31 wherein
 for decision of said adjustment amount, a least-squares method is used.

33. The image forming characteristics adjusting method according to claim 32 wherein
 for decision of said adjustment amount, a Zernike sensitivity table is used, said Zernike sensitivity table being obtained by giving a predetermined value of aberration to each term in a Zernike polynomial and calculating an image forming characteristic that becomes an evaluation item of said projection optical system in each of a plurality of terms in said Zernike polynomial.

34. The image forming characteristics adjusting method according to claim 32 wherein
 information related to wavefront of said projection optical system is measured at each of a plurality of points within a predetermined area, in which a pattern is projected, in a field of said projection optical system, and the measurement information is used for decision of said image forming characteristic.

35. An exposure apparatus that transfers a pattern onto an object via a projection optical system, said exposure apparatus comprising:
 an adjusting unit that adjusts an image forming state of a pattern image projected onto said object via said projection optical system; and
 a computing unit that optimizes a weighting function to compensate an error of said pattern image, and calculates adjustment information in said adjusting unit, based on information related to wavefront aberration of said projection optical system and a Zernike sensitivity table corresponding to projection conditions of said pattern image.

36. The exposure apparatus according to claim 35 wherein
 for the calculation of said adjustment information, data related to a relation between an adjustment amount of said adjusting unit and a change in coefficients of each term in a Zernike polynomial is used.

37. The exposure apparatus according to claim 36 wherein said adjustment information includes an adjustment amount related to at least one of movement of an optical element of said projection optical system and a characteristic of illumination light used for projection of said pattern image.

38. The exposure apparatus according to claim 37 wherein said projection conditions include at least an illumination condition of a pattern arranged on an object plane of said projection optical system.

39. The exposure apparatus according to claim 38 wherein when different patterns are each transferred via said projection optical system, said adjustment information is calculated using a Zernike sensitivity table for each of said patterns.

40. The exposure apparatus according to claim 35 wherein said adjustment information includes an adjustment amount related to at least one of movement of an optical element of said projection optical system and a characteristic of illumination light used for projection of said pattern image.

41. The exposure apparatus according to claim 40 wherein said projection conditions include at least an illumination condition of a pattern arranged on an object plane of said projection optical system.

42. The exposure apparatus according to claim 35 wherein for the calculation of said adjustment information, data of a relation between an adjustment amount of an optical element and a change in coefficients of each term in a Zernike polynomial is used, and
in order to adjust the image forming state of said pattern image, said optical element is moved based on said calculated adjustment information.

43. A device manufacturing method including a lithographic process, wherein
in said lithographic process, said adjusting unit is controlled based on said calculated adjustment information, and a pattern is transferred onto a substrate via said projection optical system, using the exposure apparatus according to claim 35.

44. An exposure apparatus that transfers a pattern onto an object via a projection optical system, said exposure apparatus comprising:
a storage unit that stores data related to a relation between an adjustment amount of an optical element of said projection optical system and a change in coefficients of each term in a Zernike polynomial; and
an adjusting unit that adjusts at least one image forming characteristic of said projection optical system based on information related to wavefront aberration of said projection optical system and said data.

45. The exposure apparatus according to claim 44 wherein said information related to wavefront aberration is expressed in a Zernike polynomial, and said adjusting unit decides said adjustment amount of said optical element by performing different weighting on a plurality of terms in said Zernike polynomial to adjust said image forming characteristic of a plurality of types of said projection optical system.

46. A device manufacturing method including a lithographic process, wherein
in said lithographic process, in order to transfer a pattern of a mask onto a substrate using an exposure apparatus having a projection optical system, an image forming characteristic of said projection optical system is adjusted, based on data of a relation between an adjustment amount of an optical element of said projection optical system and a change in coefficients of each term in a Zernike polynomial, and information related to wavefront aberration of said projection optical system.

47. An exposure apparatus that transfers a pattern onto an object via a projection optical system, said exposure apparatus comprising:
a computing unit that obtains a targeted image forming characteristic when a plurality of exposure conditions are settable on projecting said pattern by said projection optical system, based on information related to wavefront aberration of said projection optical system and a Zernike sensitivity table related to said targeted image forming characteristic of said projection optical system, as a linear sum of coefficients of each term in a Zernike polynomial that is decided based on said information related to wavefront aberration and said Zernike sensitivity table; and
an exposure control unit that sets an optimum exposure condition for said pattern, based on said targeted image forming characteristic that has been calculated for each of said exposure conditions.

48. The exposure apparatus according to claim 47 wherein said exposure conditions include numerical aperture of said projection optical system and an illumination condition of said pattern.

49. The exposure apparatus according to claim 47 wherein said computing unit obtains said targeted image forming characteristic using the Zernike sensitivity table for each of said exposure conditions, and when said targeted image forming characteristic includes image forming characteristics of a plurality of types, the Zernike sensitivity table is also used.

50. The exposure apparatus according to claim 49 wherein said computing unit calculates said targeted image forming characteristic when different patterns are projected by said projection optical system, using the Zernike sensitivity table for each of said patterns, and
said exposure control unit sets an optimum exposure condition for each of said different patterns, based on said targeted image forming characteristic that has been calculated for each of said patterns.

51. The exposure apparatus according to claim 47 wherein said computing unit obtains said targeted image forming characteristic using the Zernike sensitivity table for each of said exposure conditions, and also when different patterns are each projected by said projection optical system, calculates said targeted image forming characteristic using the Zernike sensitivity table for each of said patterns, and
said exposure control unit sets an optimum exposure condition by said different patterns, based on said targeted image forming characteristic that has been calculated for each of said patterns.

52. An exposure method in which a pattern is transferred onto an object via a projection optical system, said method comprising:
calculating a targeted image forming characteristic of said projection optical system for each of a plurality of exposure conditions settable when said pattern is projected by said projection optical system, based on information related to wavefront aberration of said projection optical system and a Zernike sensitivity table related to a targeted image forming characteristic of said projection optical system, as a linear sum of coefficients of each term in a Zernike polynomial that is decided based on said information related to wavefront aberration and said Zernike sensitivity table; and setting an optimum exposure condition with respect to said pattern, based on said targeted image forming characteristic calculated for each of said exposure conditions, and transferring said pattern onto said object.

53. An exposure method in which a pattern is transferred onto an object via a projection optical system, said method comprising:
deciding coefficients of each term in a Zernike polynomial based on information related to wavefront aberration of said projection optical system; and
calculating an image forming characteristic that becomes an evaluation item of said projection optical system, based on said decided coefficients of each term in a Zernike polynomial, and a Zernike sensitivity table that corresponds to a pattern to be transferred onto said object and an illumination condition of the pattern, as a linear sum of said decided coefficients of each term in a Zernike polynomial and said Zernike sensitivity table.

54. The exposure method according to claim 53 wherein said Zernike sensitivity table is obtained by giving a predetermined value of aberration to each term in said Zernike polynomial and calculating an image forming characteristic of said projection optical system in each of a plurality of terms in said Zernike polynomial.

55. The exposure method according to claim 54 wherein said image forming characteristic that becomes an evaluation item is calculated at each of a plurality of points within a predetermined area, in which a pattern is projected, in a field of said projection optical system.

56. A device manufacturing method, wherein
a device pattern is transferred onto a photosensitive object using said exposure method according to claim 53.

57. An exposure method in which a pattern is transferred onto an object via a projection optical system, said method comprising:
optimizing a weighting function to compensate an error of a pattern image projected onto said object, and calculating adjustment information of said projection optical system, based on information related to wavefront aberration of said projection optical system and a Zernike sensitivity table that corresponds to a pattern to be transferred onto said object and an illumination condition of the pattern; and
adjusting said projection optical system based on said calculated adjustment information.

58. The exposure method according to claim 57 wherein for the calculation of said adjustment information, a least-squares method is used.

59. The exposure method according to claim 58 wherein an adjustment amount of an optical element of said projection optical system is calculated as said adjustment information, based on data of a relation between the adjustment amount of the optical element of said projection optical system and a change in coefficients of each term in a Zernike polynomial.

60. The exposure method according to claim 59 wherein coefficients of each term in a Zernike polynomial are decided by measuring wavefront aberration of said projection optical system, and
for the calculation of said adjustment amount, said decided coefficients of each term in said Zernike polynomial are used.

61. The exposure method according to claim 60 wherein said weighting function is a function to perform weighting on said decided coefficients of each term in said Zernike polynomial.

62. The exposure method according to claim 61 wherein said adjustment amount is calculated by optimizing said weighting function so that said error does not exceed a permissible value at each of a plurality of points within a predetermined area, in which a pattern is projected, in a field of said projection optical system.

63. The exposure method according to claim 62 wherein said Zernike sensitivity table is obtained by giving a predetermined value of aberration to each term in a Zernike polynomial and calculating an image forming characteristic of said projection optical system in each of a plurality of terms in said Zernike polynomial.

64. A device manufacturing method, wherein
a device pattern is transferred onto a photosensitive object using said exposure method according to claim 57.

65. An exposure apparatus that transfers a pattern onto an object via a projection optical system, said exposure apparatus comprising:
a measuring unit that measures information related to wavefront aberration of said projection optical system, and
a computing unit that decides coefficients of each term in a Zernike polynomial based on said information related to wavefront aberration, and calculates an image forming characteristic that becomes an evaluation item of said projection optical system, based on said decided coefficients of each term in a Zernike polynomial and a Zernike sensitivity table that corresponds to a pattern to be transferred onto said object and an illumination condition of the pattern, as a linear sum of said decided coefficients of each term in a Zernike polynomial and said Zernike sensitivity table.

66. The exposure apparatus according to claim 65
said Zernike sensitivity table is obtained by giving a predetermined value of aberration to each term in said Zernike polynomial and calculating an image forming characteristic of said projection optical system in each of a plurality of terms in said Zernike polynomial.

67. The exposure apparatus according to claim 66 wherein said image forming characteristic that becomes an evaluation item is calculated at each of a plurality of points within a predetermined area, in which a pattern is projected, in a field of said projection optical system.

68. An exposure apparatus that transfers a pattern onto an object via a projection optical system, said apparatus comprising:
a computing unit that optimizes a weighting function to compensate an error of a pattern image projected onto said object, and calculates adjustment information of said projection optical system, based on information related to wavefront aberration of said projection optical system and a Zernike sensitivity table that corresponds to a pattern to be transferred onto said object and an illumination condition of the pattern; and
an adjusting unit that adjusts said projection optical system based on said calculated adjustment information.

69. The exposure apparatus according to claim 68 wherein for the calculation of said adjustment information, the least-squares method is used.

70. The exposure apparatus according to claim 69 wherein an adjustment amount of an optical element of said projection optical system is calculated as said adjustment information, based on data of a relation between the adjustment amount of the optical element of said projection optical system and a change in coefficients of each term in a Zernike polynomial.

71. The exposure apparatus according to claim 70 wherein coefficients of each term in a Zernike polynomial are decided by measuring wavefront aberration of said projection optical system, and
for the calculation of said adjustment amount, said decided coefficients of each term in said Zernike polynomial are used.

72. The exposure apparatus according to claim 71 wherein said weighting function is a function to perform weighting on said decided coefficients of each term in said Zernike polynomial.

73. The exposure apparatus according to claim 72 wherein said adjustment amount is calculated by optimizing said weighting function so that said error does not exceed a permissible value at each of a plurality of points within a predetermined area, in which a pattern is projected, in a field of said projection optical system.

74. The exposure apparatus according to claim 73 wherein said Zernike sensitivity table is obtained by giving a predetermined value of aberration to each term in a Zernike polynomial and calculating an image forming characteristic of said projection optical system in each of a plurality of terms in said Zernike polynomial.

75. The exposure apparatus according to claim 74, further comprising:
a setting unit that is capable of changing an illumination condition of said pattern, wherein
when said illumination condition is changed by said setting unit, said computing unit uses a Zernike sensitivity table corresponding to said changed illumination condition.

76. The exposure apparatus according to claim 68, further comprising:
a measuring unit that measures wavefront aberration of said projection optical system, said measuring unit being at least partly attachable to an exposure apparatus main body including said projection optical system.

77. A computer readable medium encoded with a program that makes a control computer of an exposure apparatus that transfers a pattern onto an object via a projection optical system execute a predetermined process, said program making said control computer execute:
a deciding procedure in which coefficients of each terms of a Zernike polynomial are decided based on information related to wavefront aberration of said projection optical system; and
a calculating procedure in which an image forming characteristic that becomes an evaluation item of said projection optical system is calculated, based on said decided coefficients of each term of a Zernike polynomial and a Zernike sensitivity table that corresponds to a pattern to be transferred onto said object and an illumination condition of the pattern, as a linear sum of said decided coefficients of each term in a Zernike polynomial and said Zernike sensitivity table.

78. A computer readable medium encoded with a program that makes a control computer of an exposure apparatus that transfers a pattern onto an object via a projection optical system execute a predetermined process, said program making said control computer execute:
a calculating procedure in which a weighting function to compensate an error of a pattern image projected onto said object is optimized, and adjustment information of said projection optical system is calculated, based on information related to wavefront aberration of said projection optical system, and a Zernike sensitivity table that corresponds to a pattern to be transferred onto said object and an illumination condition of the pattern; and
an adjusting procedure in which said projection optical system is adjusted based on said calculated adjustment information.

79. A computer readable medium encoded with a program that makes a control computer of an exposure apparatus that transfers a pattern onto an object via a projection optical system execute a predetermined process, said program making said control computer execute:
a measuring procedure in which information related to wavefront aberration of said projection optical system is measured; and
an adjusting procedure in which an image forming characteristic of said projection optical system is adjusted by driving an optical element of said projection optical system, based on data of a relation between an adjustment amount of said optical element and a change in coefficients of each term in a Zernike polynomial, and said information related to wavefront aberration.

80. A computer readable medium encoded with a program that makes a control computer of an exposure apparatus that transfers a pattern onto an object via a projection optical system execute a predetermined process, said program making said control computer execute:
a calculation procedure in which an image forming characteristic for each of a plurality of exposure conditions is calculated, based on coefficients of each term in a Zernike polynomial that is decided based on information related to wavefront aberration of said projection optical system, and a Zernike sensitivity table corresponding to each of said plurality of exposure conditions that are settable when projecting said pattern by said projection optical system, as a linear sum of said decided coefficients of each term in a Zernike polynomial and said Zernike sensitivity table; and
a transferring procedure in which an optimum exposure condition for said pattern is set based on said image forming characteristic calculated for each of said exposure conditions, and said pattern is transferred onto said object.

* * * * *